US012593654B2

(12) United States Patent
Okita et al.

(10) Patent No.: US 12,593,654 B2
(45) Date of Patent: Mar. 31, 2026

(54) SUBSTRATE ALIGNMENT DEVICE, SUBSTRATE PROCESSING APPARATUS, SUBSTRATE ALIGNMENT METHOD AND SUBSTRATE PROCESSING METHOD

(71) Applicant: SCREEN HOLDINGS CO., LTD.,
Kyoto (JP)

(72) Inventors: Nobuaki Okita, Kyoto (JP); Tomoyuki Shinohara, Kyoto (JP); Junichi Ishii, Kyoto (JP); Kazuki Nakamura, Kyoto (JP); Takashi Shinohara, Kyoto (JP); Takuma Takahashi, Kyoto (JP); Yoshifumi Okada, Kyoto (JP); Hiroshi Kato, Kyoto (JP)

(73) Assignee: SCREEN HOLDINGS CO., LTD. (JP)

( * ) Notice: Subject to any disclaimer, the term of this patent is extended or adjusted under 35 U.S.C. 154(b) by 866 days.

(21) Appl. No.: 17/858,305

(22) Filed: Jul. 6, 2022

(65) Prior Publication Data

US 2023/0010624 A1       Jan. 12, 2023

(30) Foreign Application Priority Data

Jul. 7, 2021       (JP) ................................ 2021-112852

(51) Int. Cl.
*H01L 21/687*        (2006.01)
*H01L 21/68*          (2006.01)
(52) U.S. Cl.
CPC ........ *H01L 21/68* (2013.01); *H01L 21/68728* (2013.01); *H01L 21/68735* (2013.01); *H01L 21/68742* (2013.01)
(58) Field of Classification Search
CPC .............. H01L 21/68; H01L 21/68728; H01L 21/68735; H01L 21/68742;

(Continued)

(56) References Cited

U.S. PATENT DOCUMENTS

2004/0245956 A1    12/2004  Kurita et al. ................. 318/560
2006/0234503 A1    10/2006  Yamada et al. ............... 438/667
(Continued)

FOREIGN PATENT DOCUMENTS

CN        110100043 A      8/2019
CN        110504203 A     11/2019
(Continued)

OTHER PUBLICATIONS

Office Action dated Mar. 18, 2025 issued in corresponding Japanese Patent Application No. 2021-112852.

(Continued)

*Primary Examiner* — Lynn E Schwenning
(74) *Attorney, Agent, or Firm* — OSTROLENK FABER LLP

(57)            ABSTRACT

A substrate alignment device includes first and second support members that are arranged to be opposite to each other and be spaced apart from each other in a plan view, and respectively support an outer peripheral end of a substrate from a position below the substrate. Further, the substrate alignment device includes a first pressing member that is arranged to be opposite to the first support member in a plan view, and moves the substrate by pressing one portion of the outer peripheral end of the substrate in a first direction directed from the second support member toward the first support member with the substrate supported by the first and second support members. The first support member includes a movement limiter that limits movement of the substrate in the first direction past a predetermined prescribed position.

12 Claims, 18 Drawing Sheets

(58) Field of Classification Search

CPC ......... H01L 21/67051; H01L 21/67748; H01L 21/6838; H01L 21/68764; H01L 21/68785; H01L 21/67046; H01L 21/68721

See application file for complete search history.

(56) References Cited

U.S. PATENT DOCUMENTS

| | | | |
|---|---|---|---|
| 2007/0023277 A1 | 2/2007 | Mizohata et al. ............ 204/212 | |
| 2008/0189975 A1 | 8/2008 | Miya ............................... 34/317 | |
| 2013/0051967 A1 | 2/2013 | Muramoto .................... 414/758 | |
| 2014/0030048 A1 | 1/2014 | Kosuge et al. .......... 414/225.01 | |
| 2015/0027492 A1 | 1/2015 | Takiguchi et al. ................ 134/6 | |
| 2016/0233118 A1 | 8/2016 | Kosuge et al. | |
| 2016/0284585 A1 | 9/2016 | Kobayashi et al. | |
| 2017/0256434 A1 | 9/2017 | Rashkovsky et al. | |
| 2018/0350632 A1* | 12/2018 | Kikumoto ............. H01L 21/681 | |
| 2019/0067077 A1 | 2/2019 | Muramoto | |
| 2019/0096729 A1* | 3/2019 | Muramoto ........ H01L 21/68707 | |
| 2019/0244835 A1* | 8/2019 | Nishida ............ H01L 21/67051 | |

FOREIGN PATENT DOCUMENTS

| | | | |
|---|---|---|---|
| JP | H07-306153 | A | 11/1995 |
| JP | H08-313856 | A | 11/1996 |
| JP | 2010-021257 | A | 1/2010 |
| JP | 2013-046022 | A | 3/2013 |
| JP | 2014-024161 | A | 2/2014 |
| JP | 2015-023248 | A | 2/2015 |
| JP | 5904169 | B2 | 4/2016 |
| JP | 2016-189452 | A | 11/2016 |
| JP | 2018-206877 | A | 12/2018 |
| JP | 2019-061996 | A | 4/2019 |
| KR | 10-2019-0024661 | A | 3/2019 |
| KR | 10-2019-0096267 | A | 8/2019 |
| KR | 10-2021-0057509 | A | 5/2021 |
| TW | 202004953 | A | 1/2020 |

OTHER PUBLICATIONS

Decision to Grant a Patent dated Sep. 20, 2024 issued in corresponding Korean Application No. 10-2022-0081165.

Decision to Grant a Patent dated Apr. 14, 2023 issued in corresponding Taiwanese Patent Application No. 111123824.

Office Action dated Apr. 29, 2024 issued in corresponding KR Application No. 10-2022-0081165.

* cited by examiner

F I G. 1
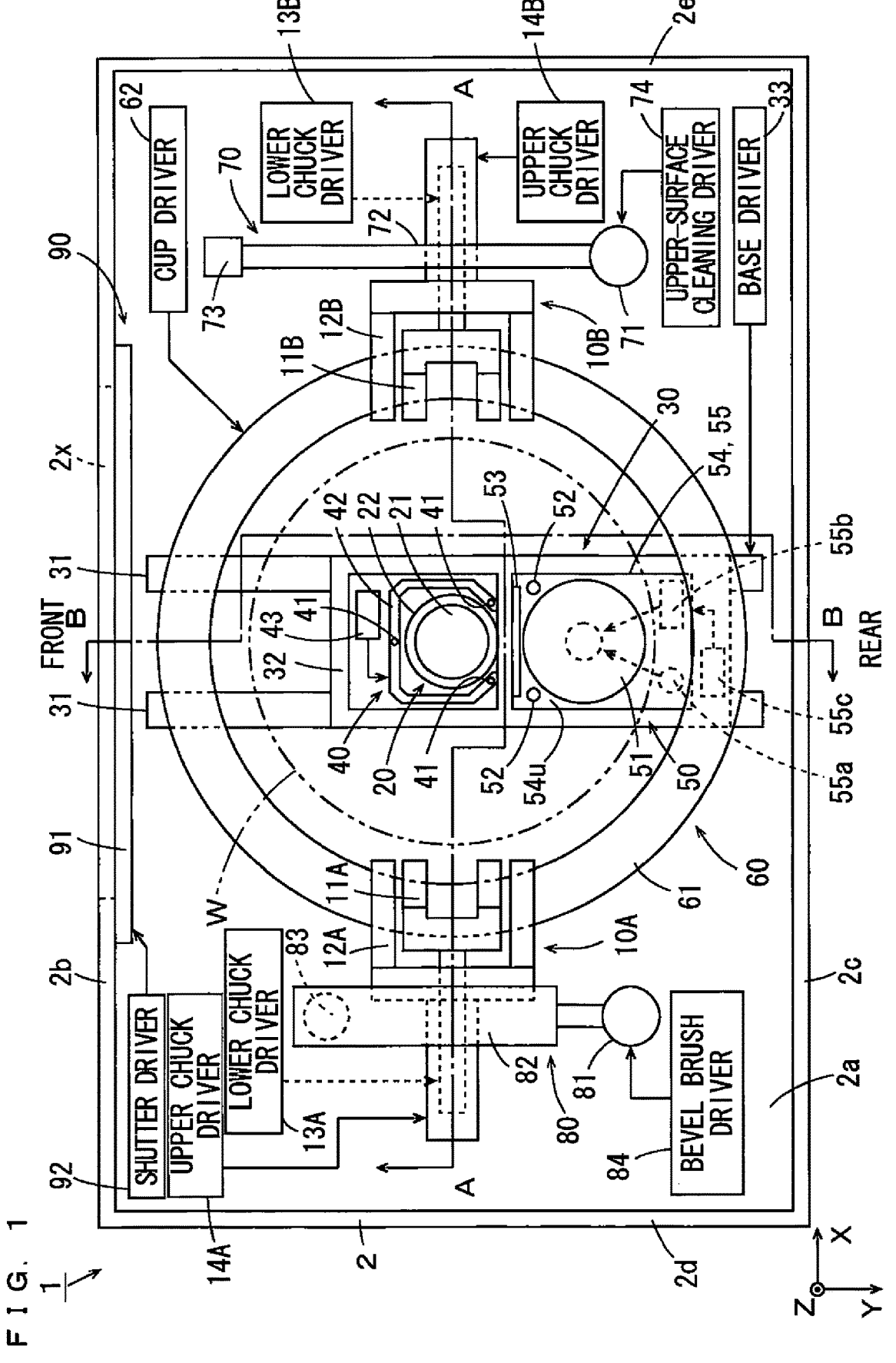

F I G.  2
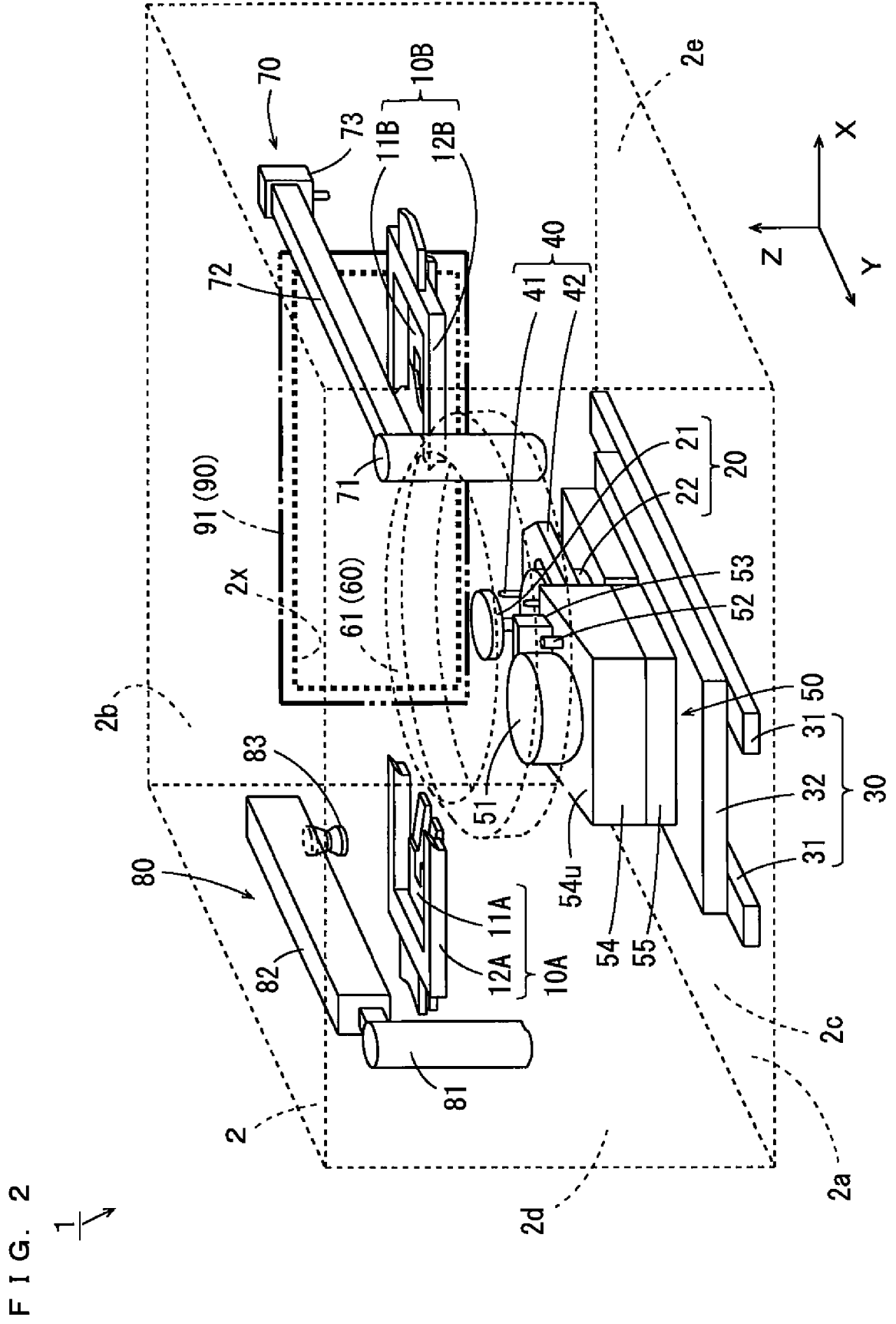

F I G. 3
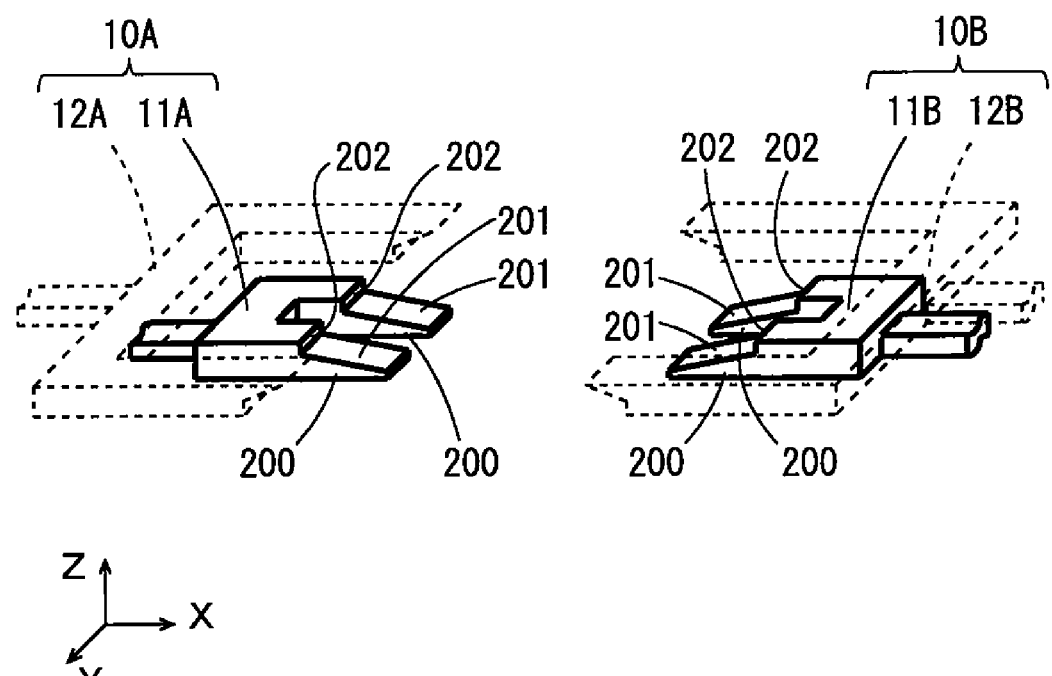
F I G. 4
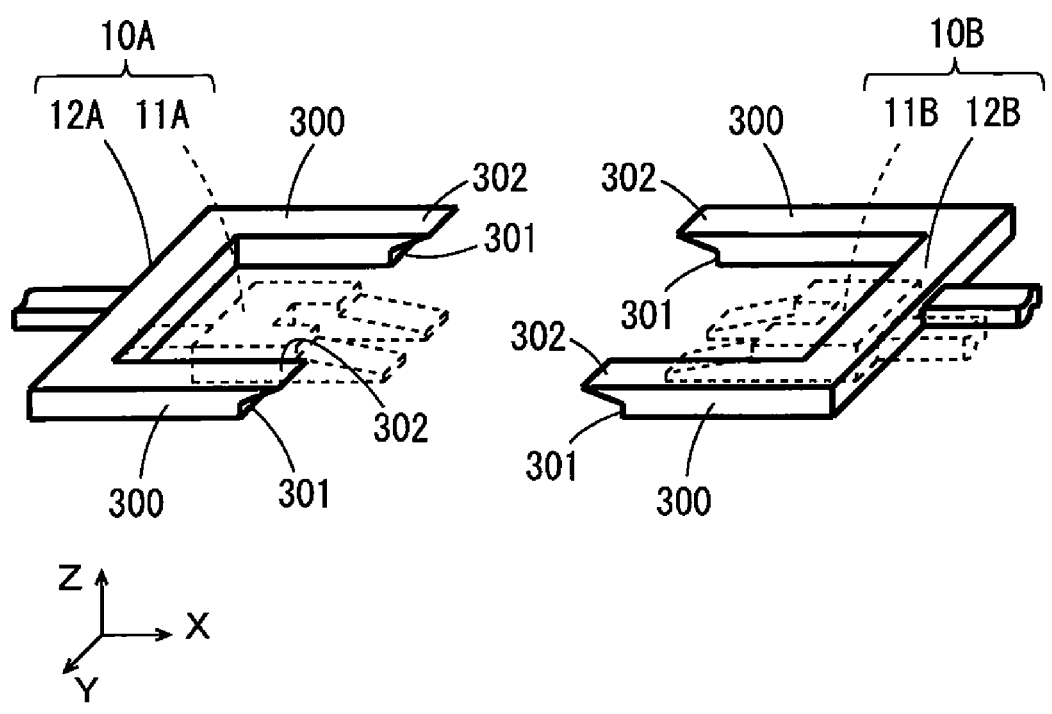

F I G. 5
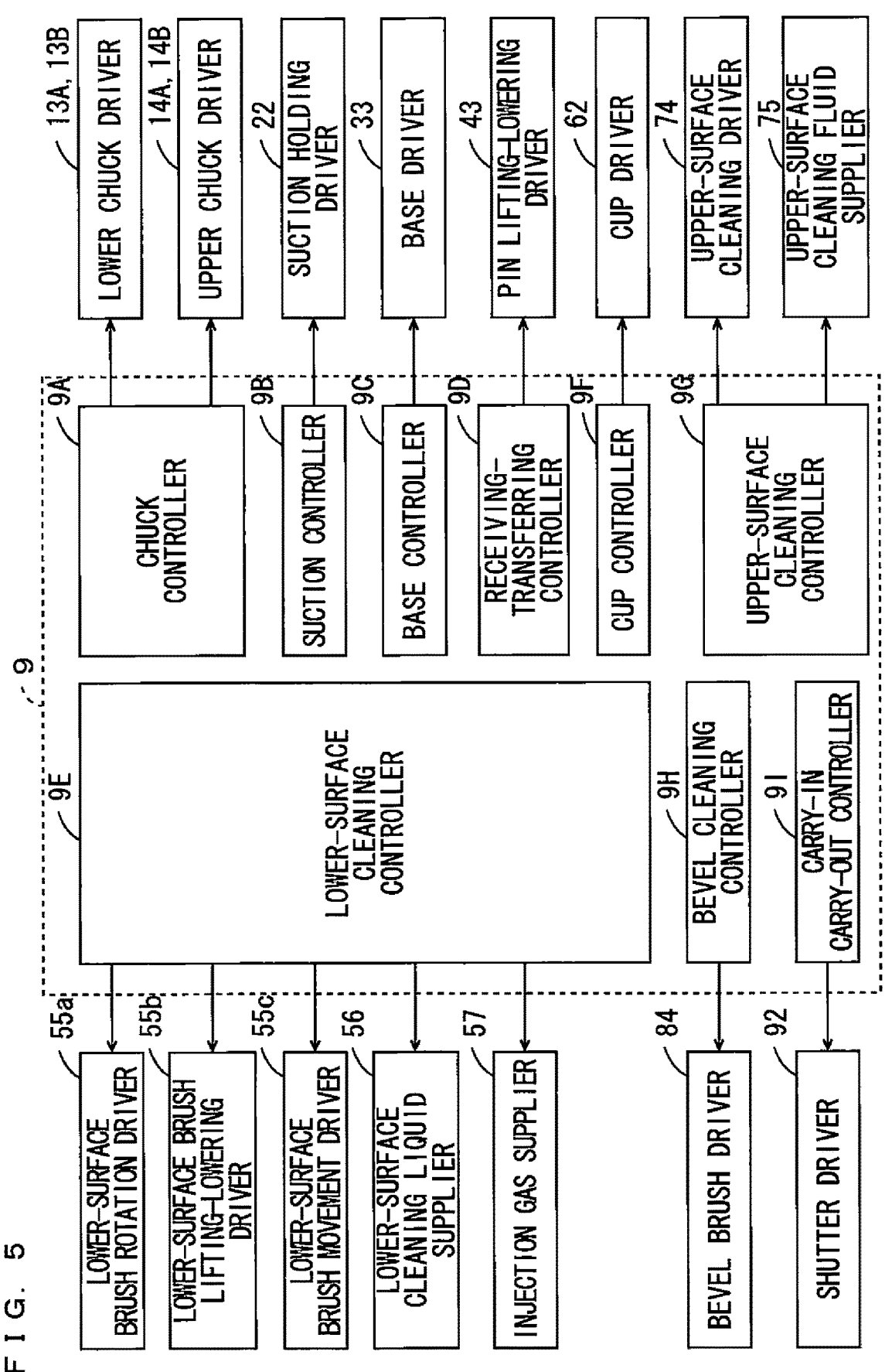

F I G. 6
PLAN VIEW
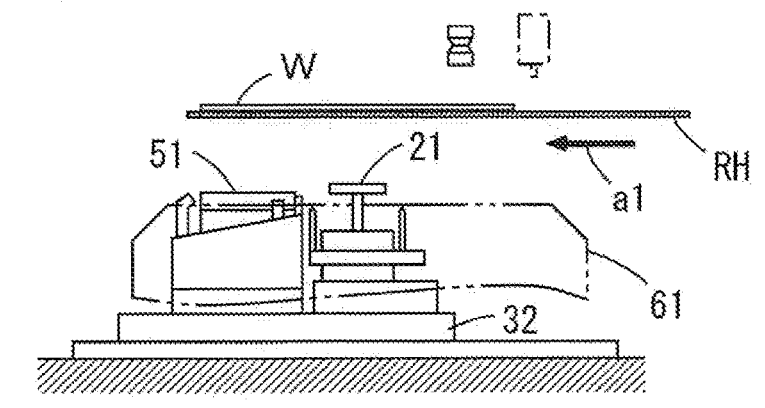
Z ⊙ → X
Y ↓
SIDE VIEW TAKEN ALONG LINE A-A
Z ↑
Y ⊙ → X
SIDE VIEW TAKEN ALONG LINE B-B
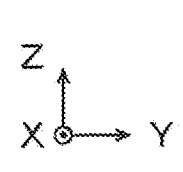
Z ↑
X ⊙ → Y
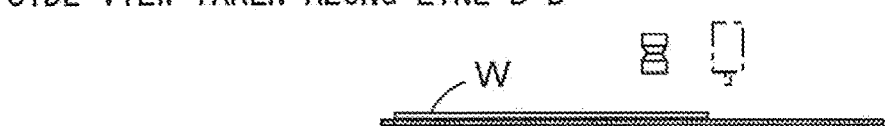

F I G.  7
PLAN VIEW
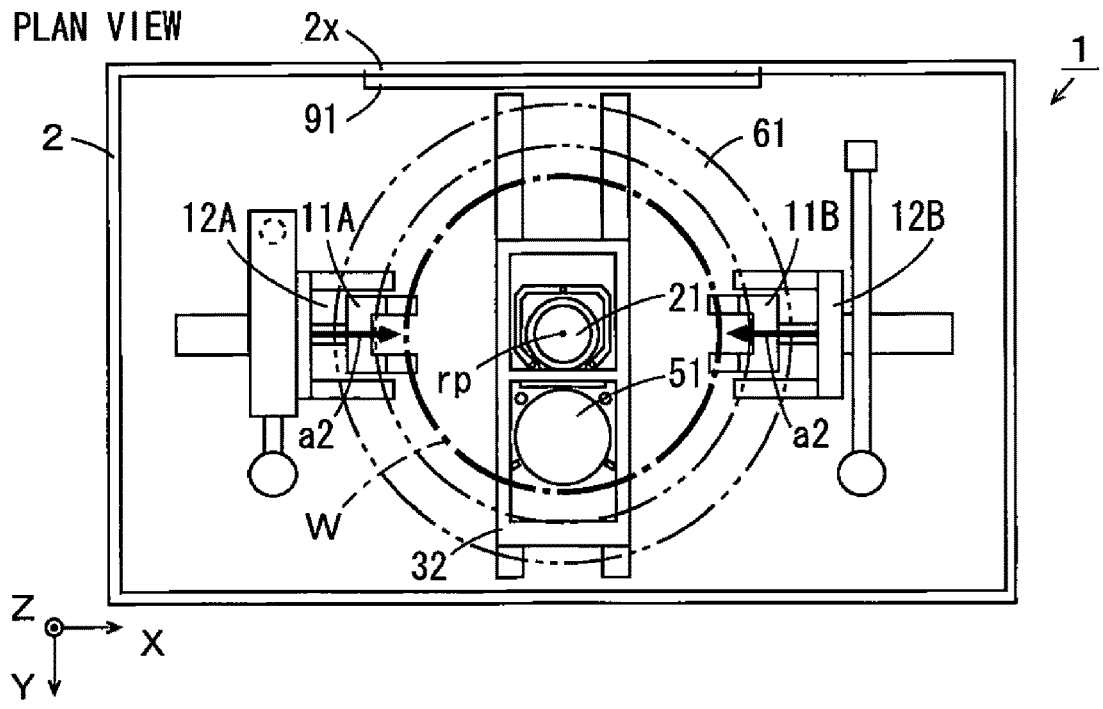
SIDE VIEW TAKEN ALONG LINE A–A
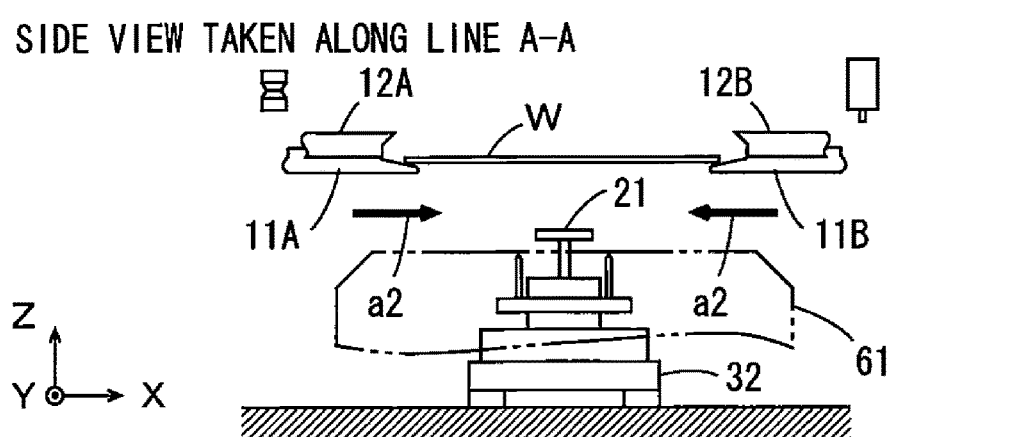
SIDE VIEW TAKEN ALONG LINE B–B
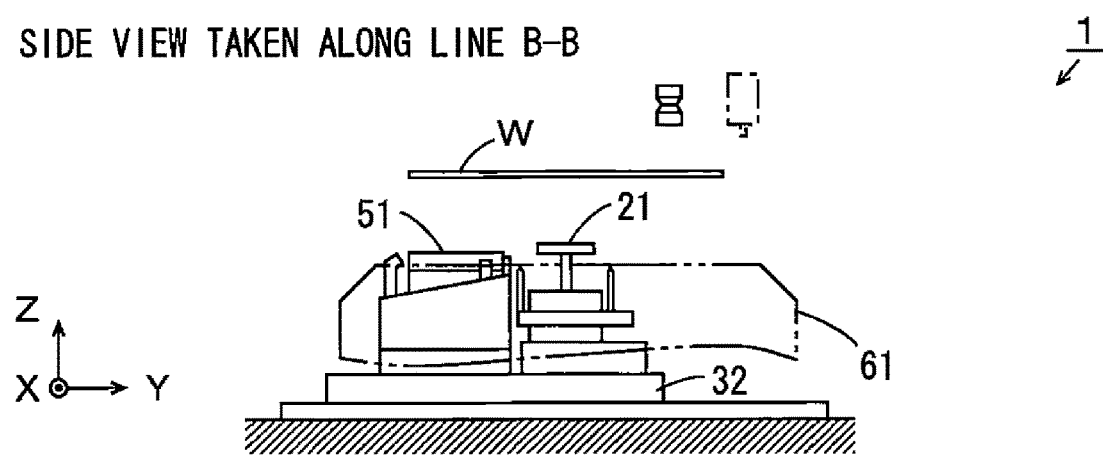

F I G.  8
PLAN VIEW
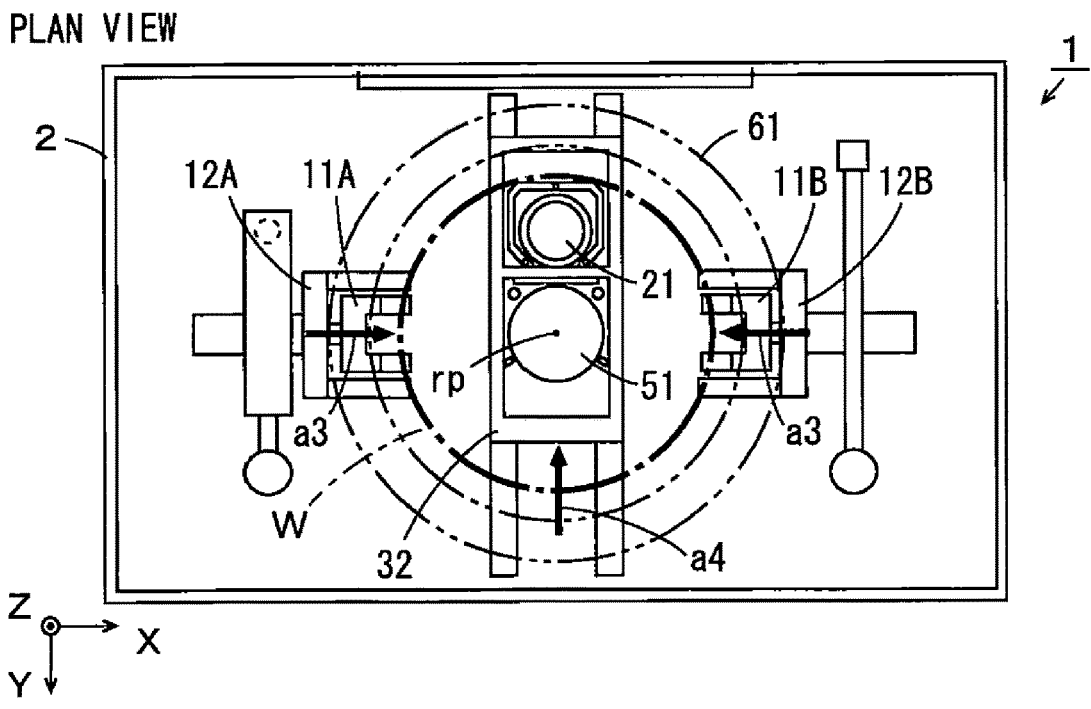
SIDE VIEW TAKEN ALONG LINE A–A
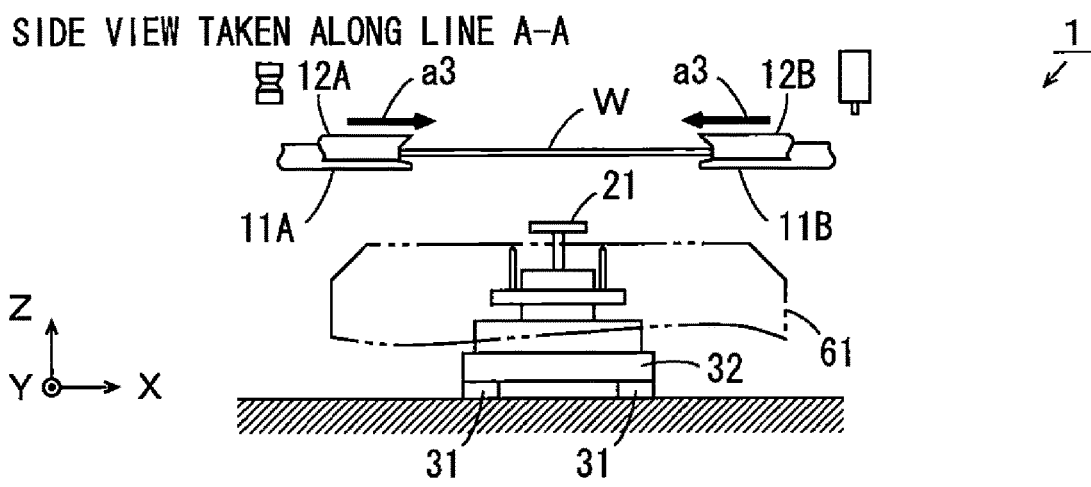
SIDE VIEW TAKEN ALONG LINE B–B
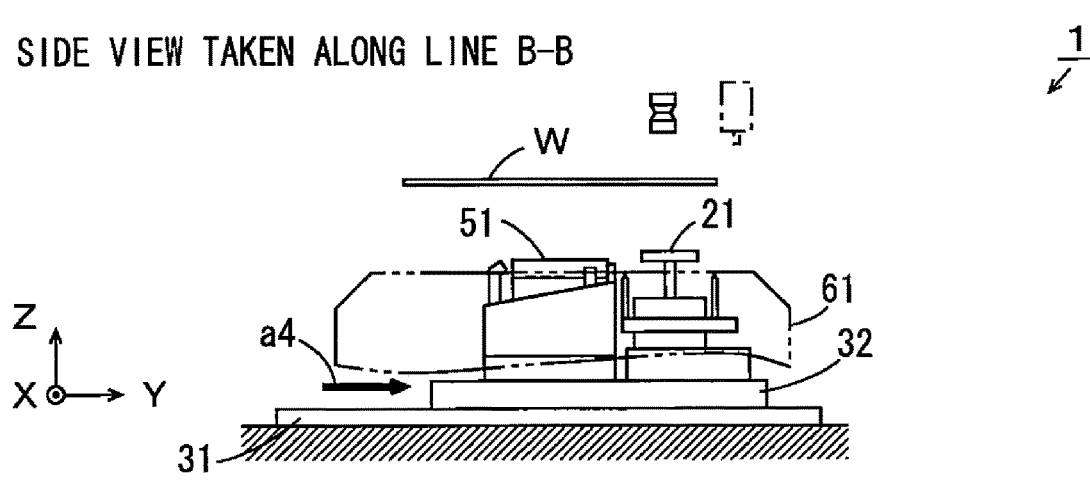

FIG. 9
PLAN VIEW
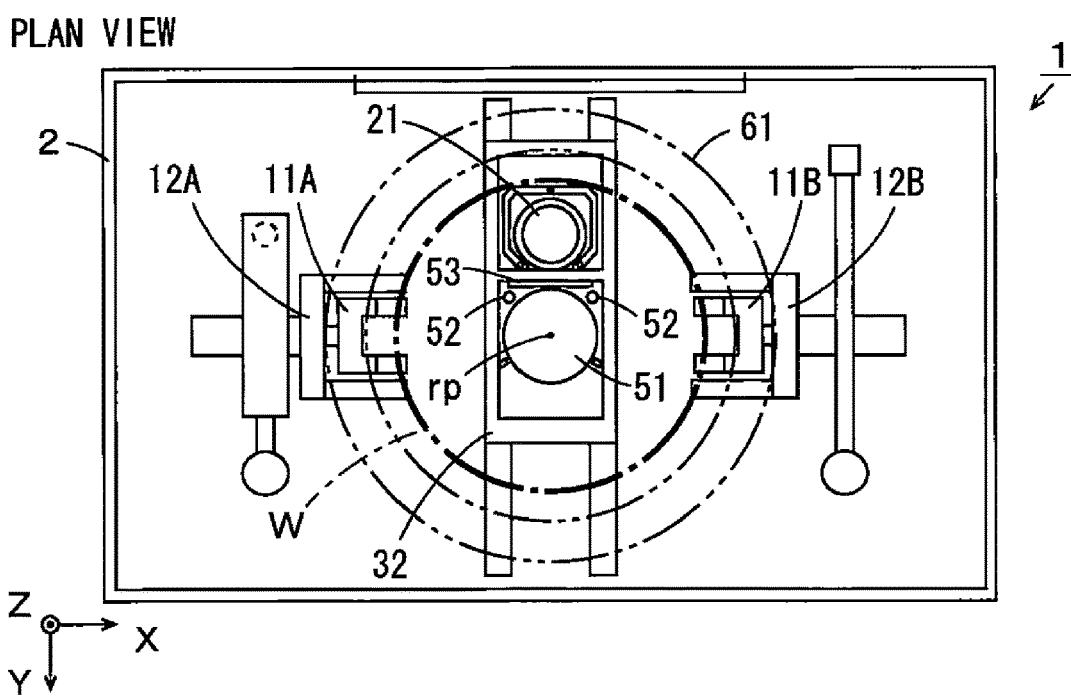
SIDE VIEW TAKEN ALONG LINE A-A
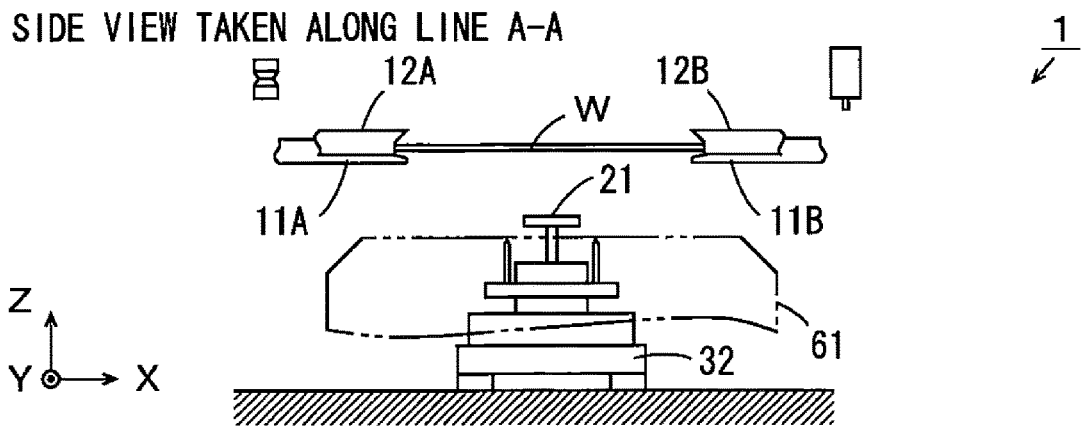
SIDE VIEW TAKEN ALONG LINE B-B
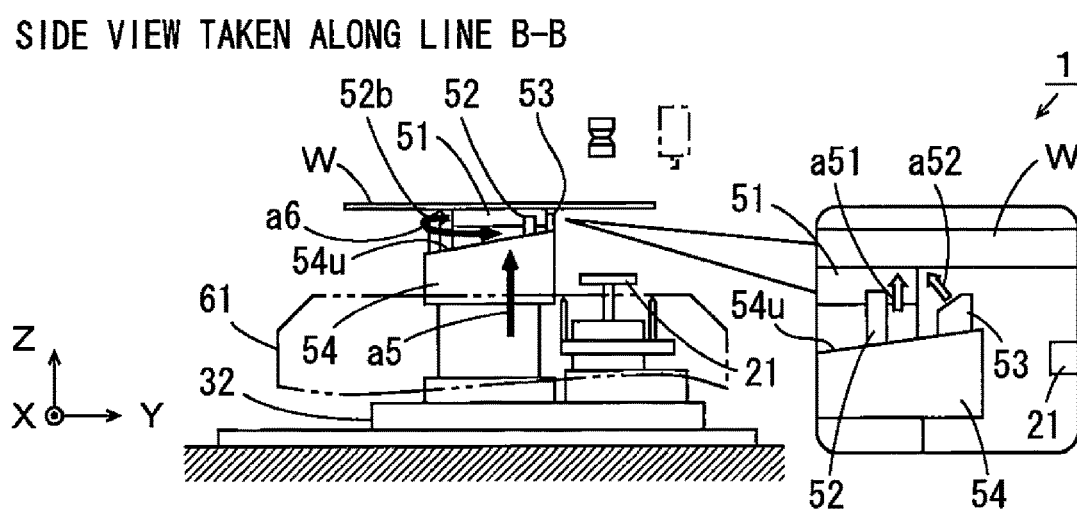

FIG. 10
PLAN VIEW
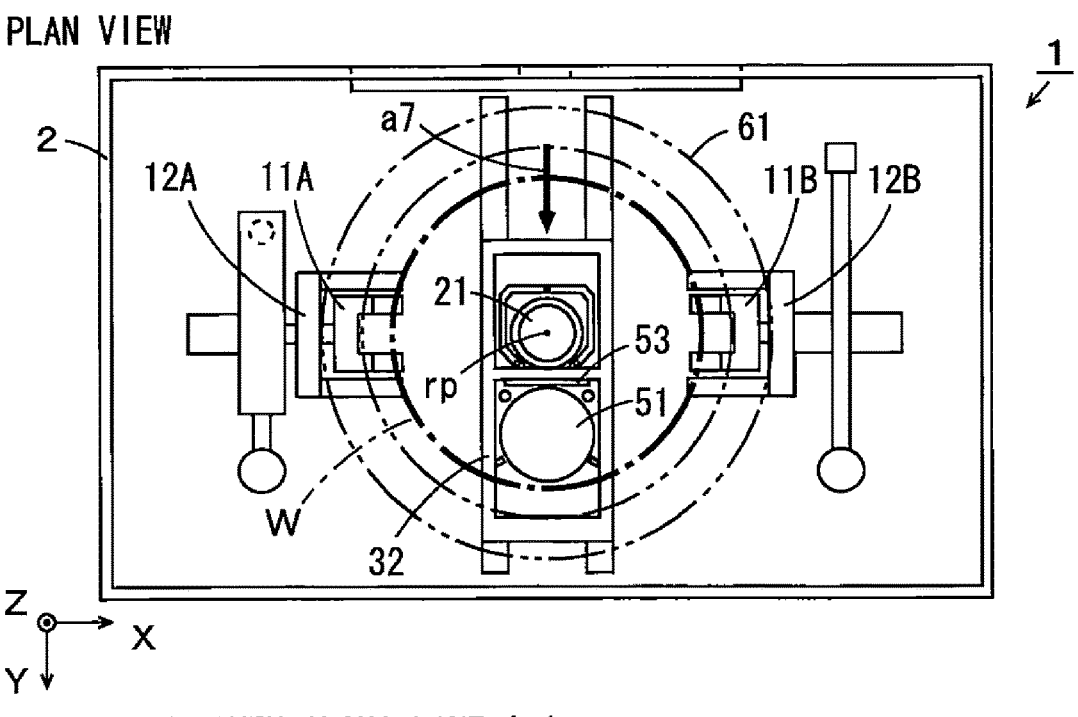
SIDE VIEW TAKEN ALONG LINE A-A
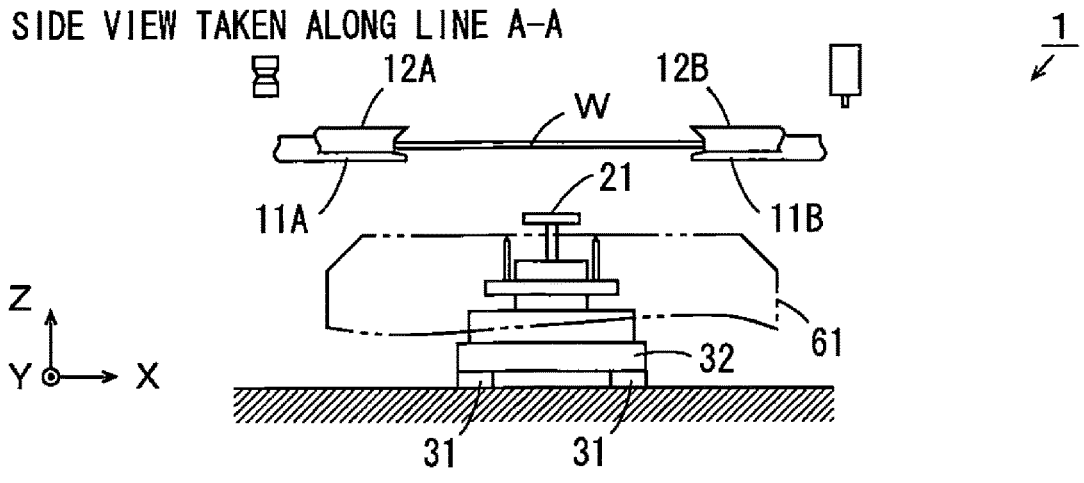
SIDE VIEW TAKEN ALONG LINE B-B
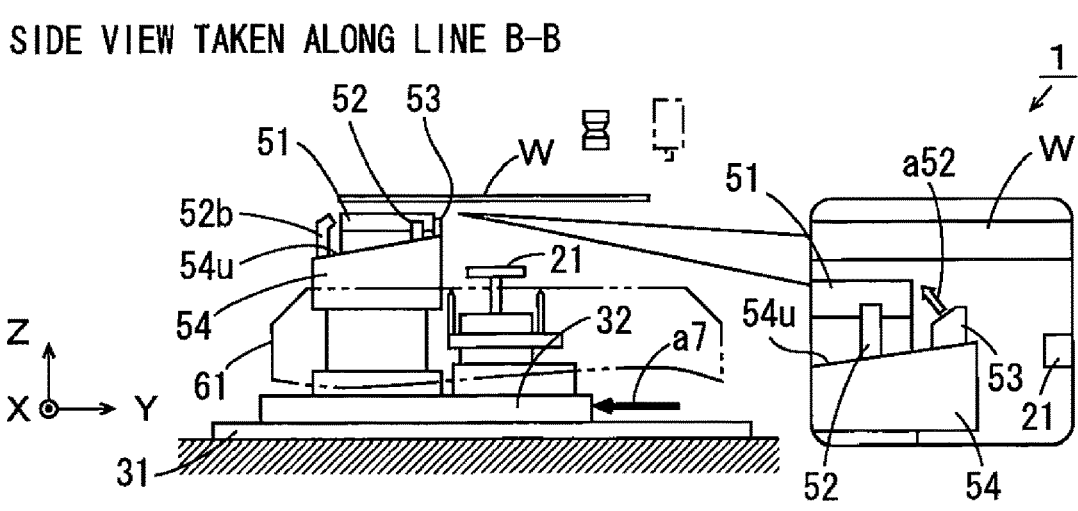

FIG. 11
PLAN VIEW
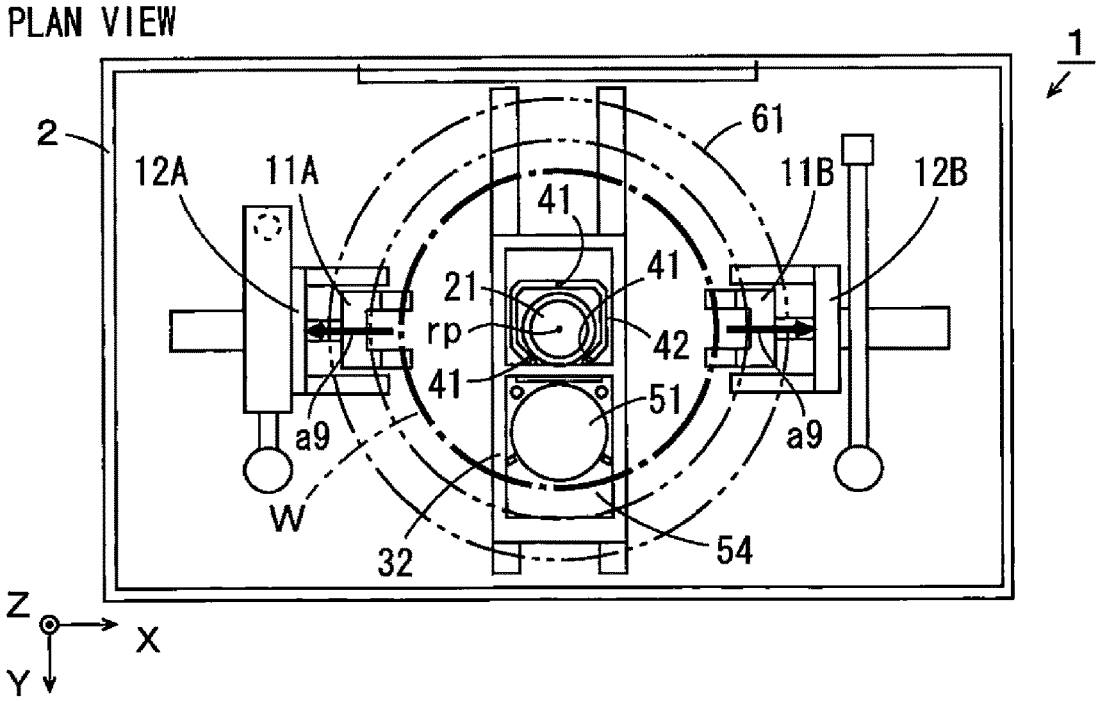
SIDE VIEW TAKEN ALONG LINE A-A
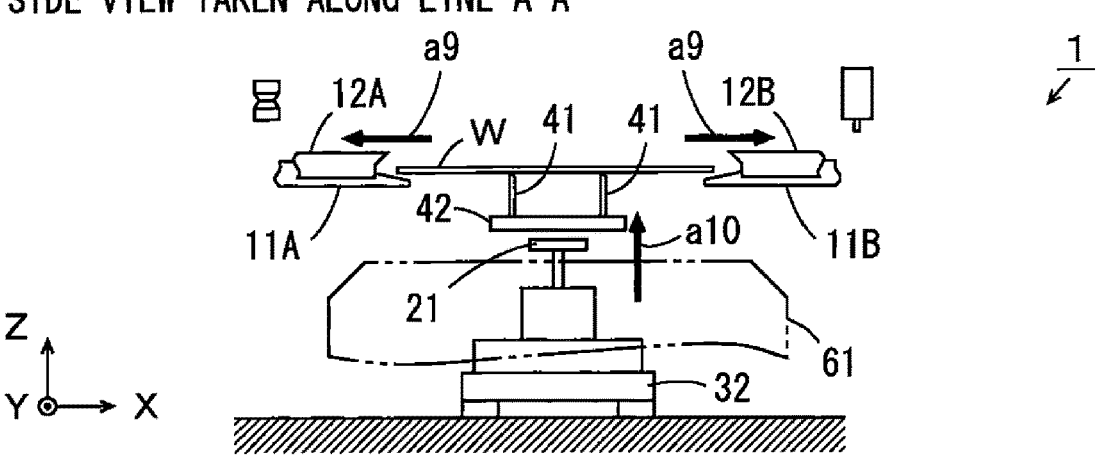
SIDE VIEW TAKEN ALONG LINE B-B
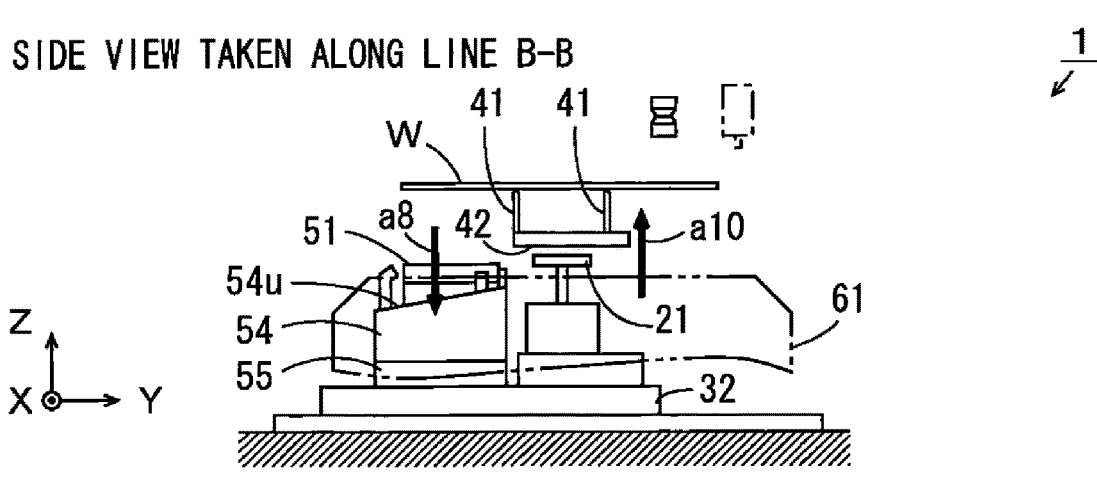

FIG. 12
PLAN VIEW
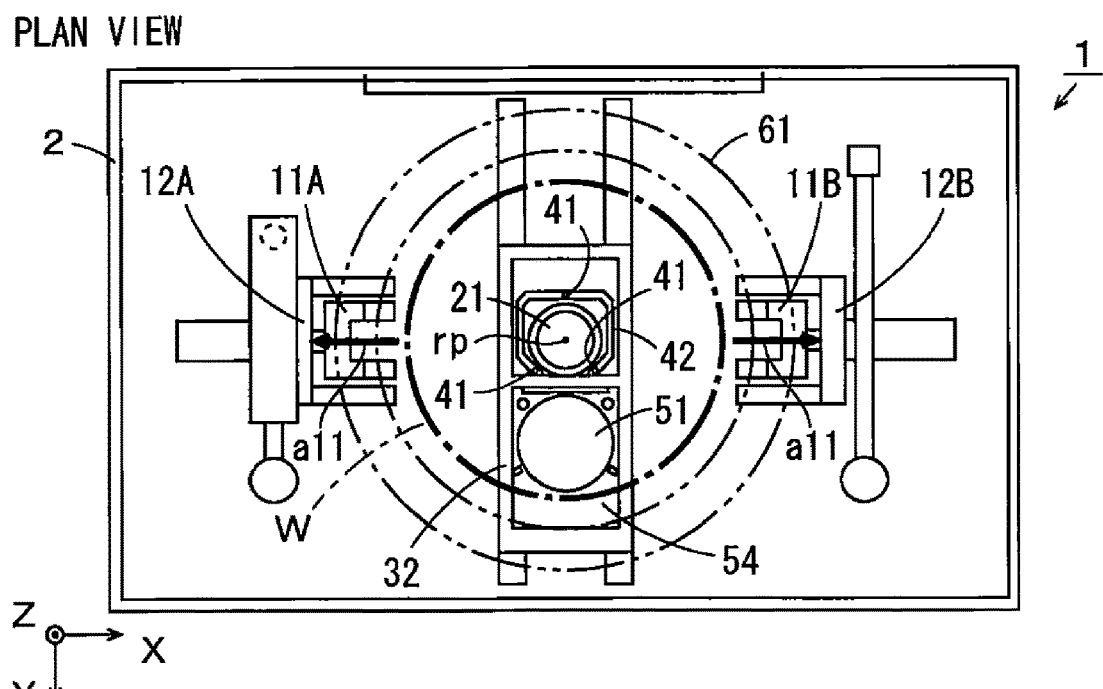
SIDE VIEW TAKEN ALONG LINE A–A
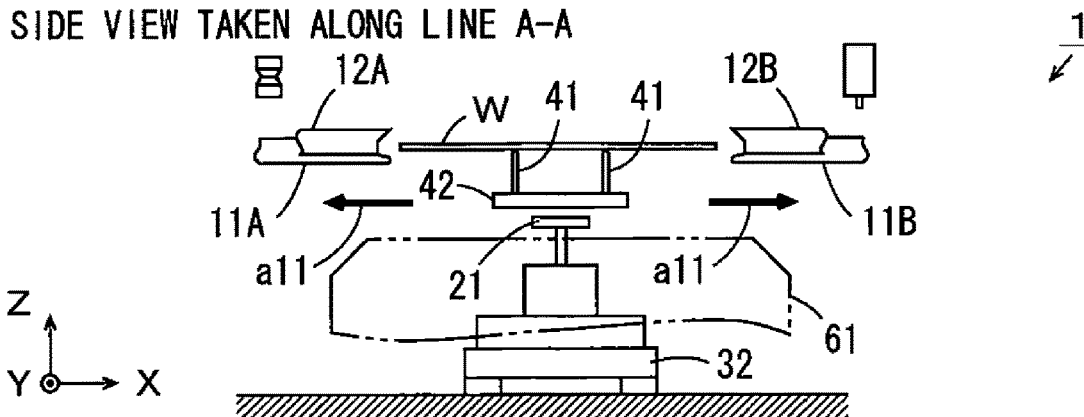
SIDE VIEW TAKEN ALONG LINE B–B
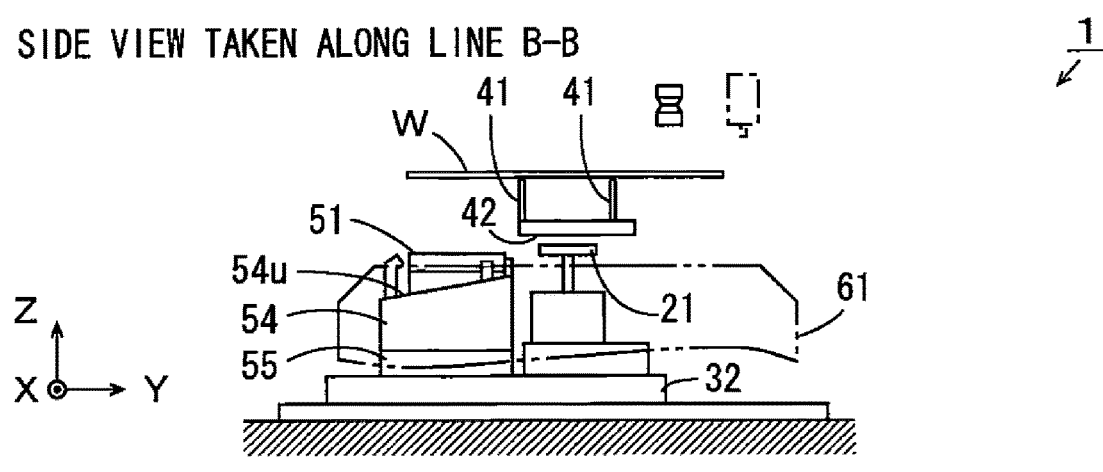

F I G.   1 3
PLAN VIEW
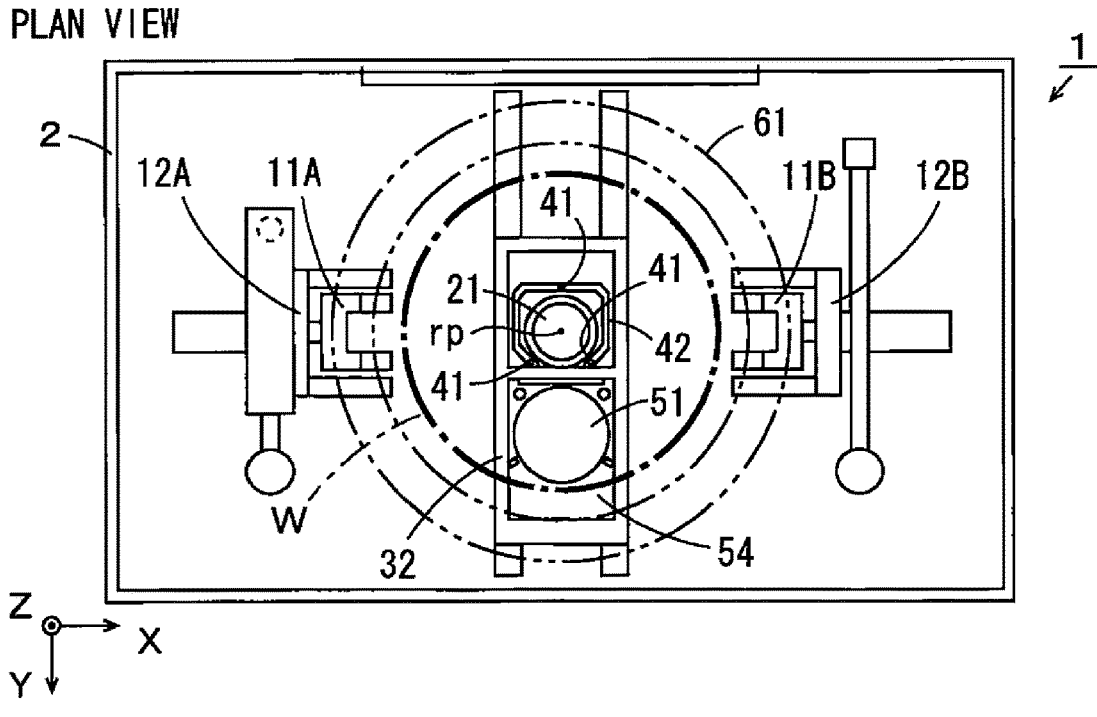
SIDE VIEW TAKEN ALONG LINE A–A
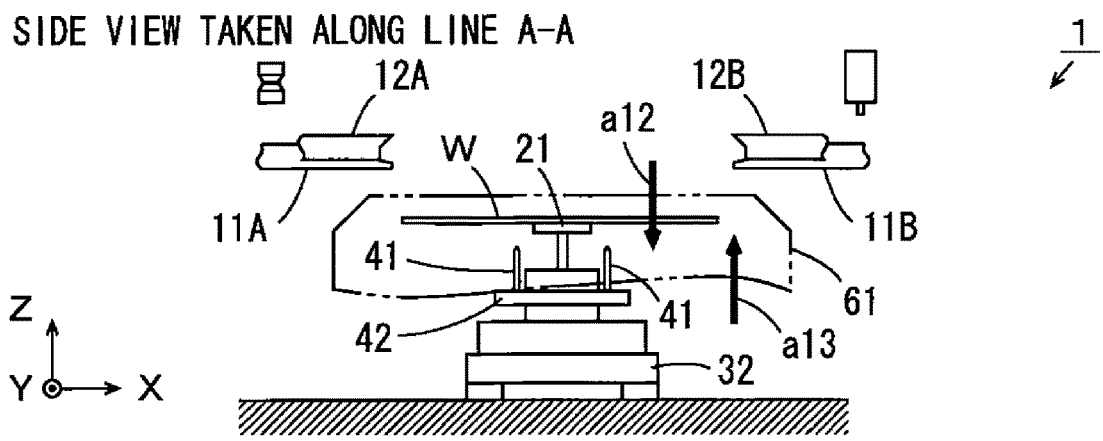
SIDE VIEW TAKEN ALONG LINE B–B
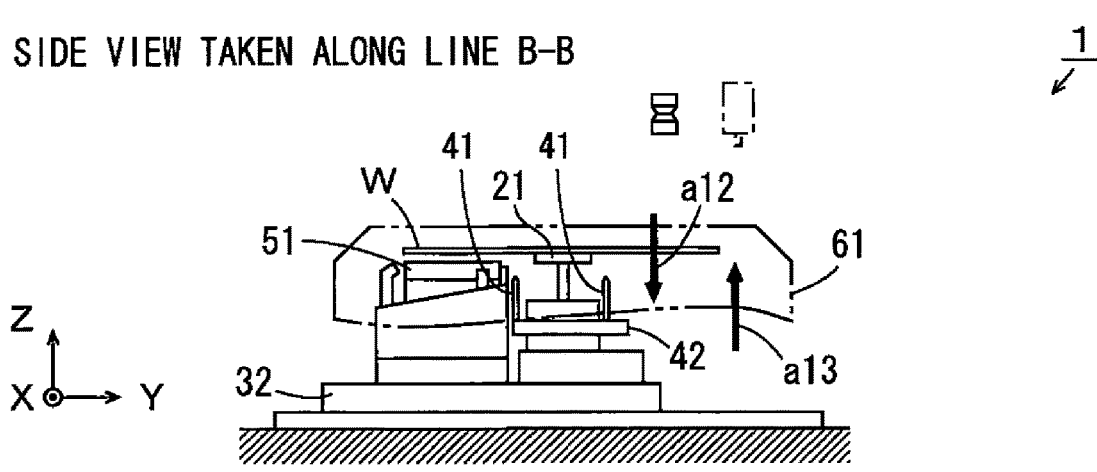

FIG. 14
PLAN VIEW
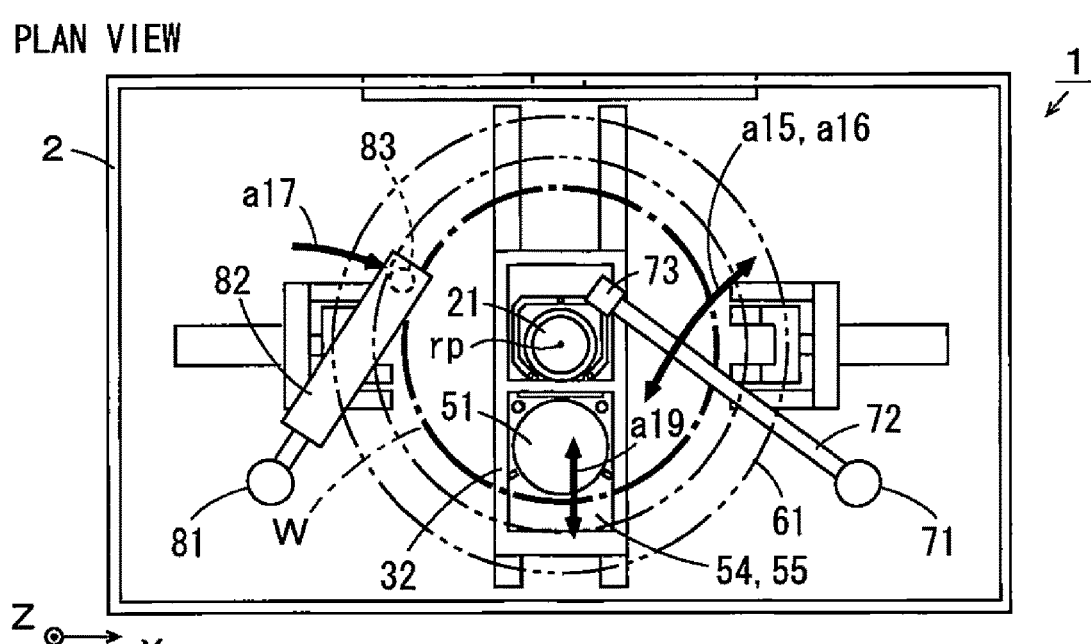
SIDE VIEW TAKEN ALONG LINE A-A
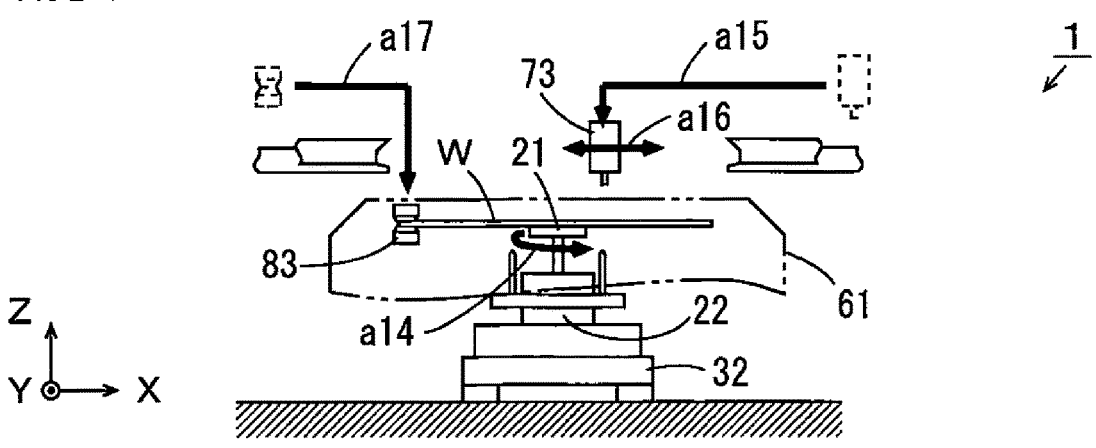
SIDE VIEW TAKEN ALONG LINE B-B
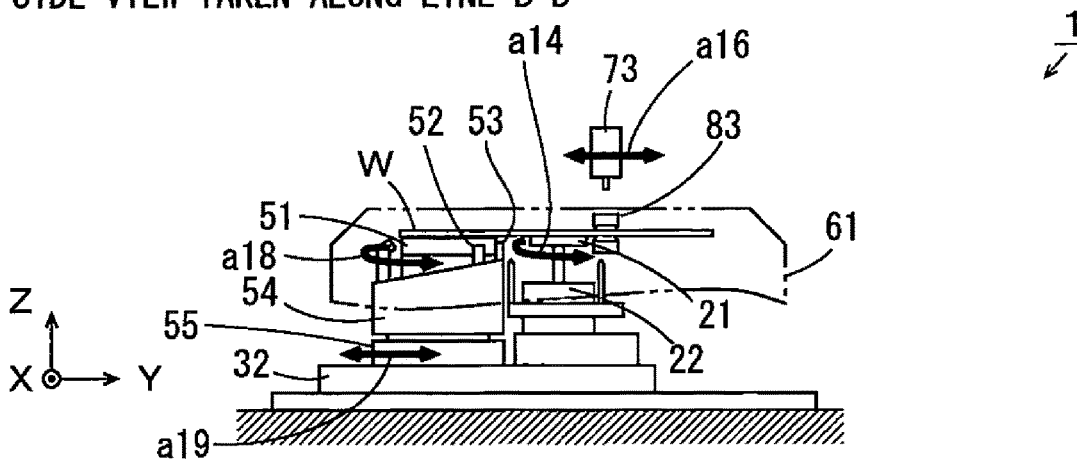

F I G. 1 5
PLAN VIEW
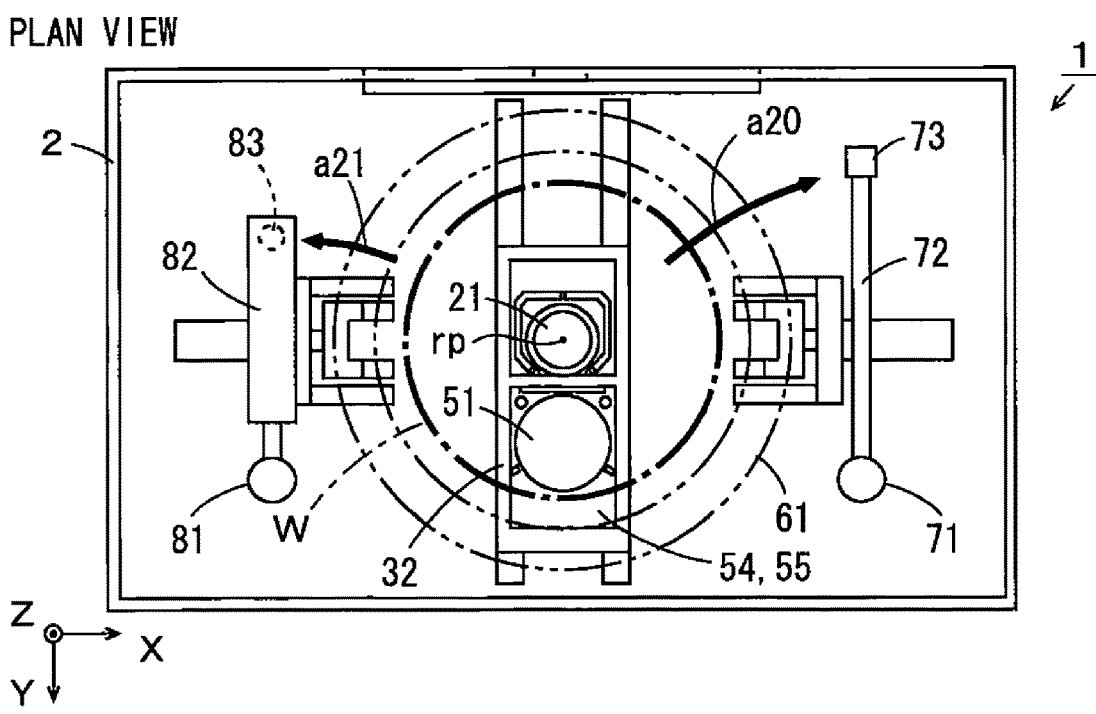
SIDE VIEW TAKEN ALONG LINE A–A
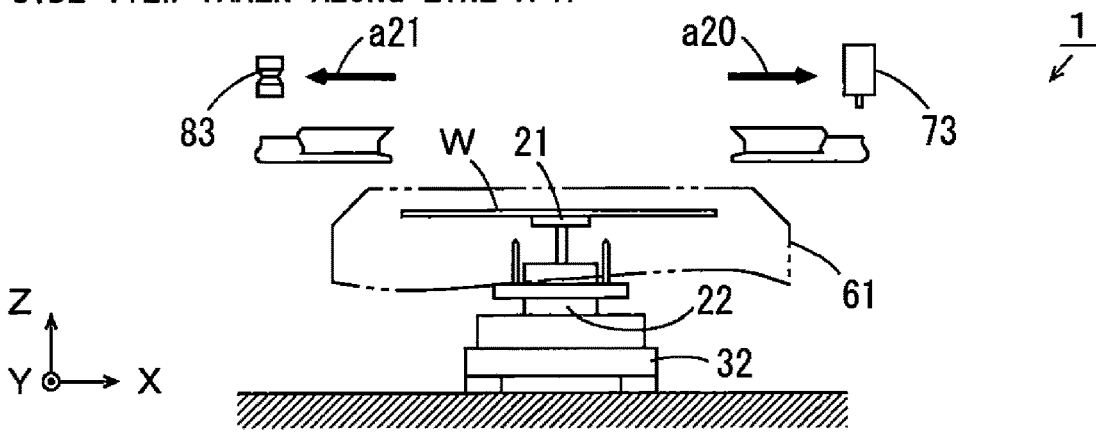
SIDE VIEW TAKEN ALONG LINE B–B
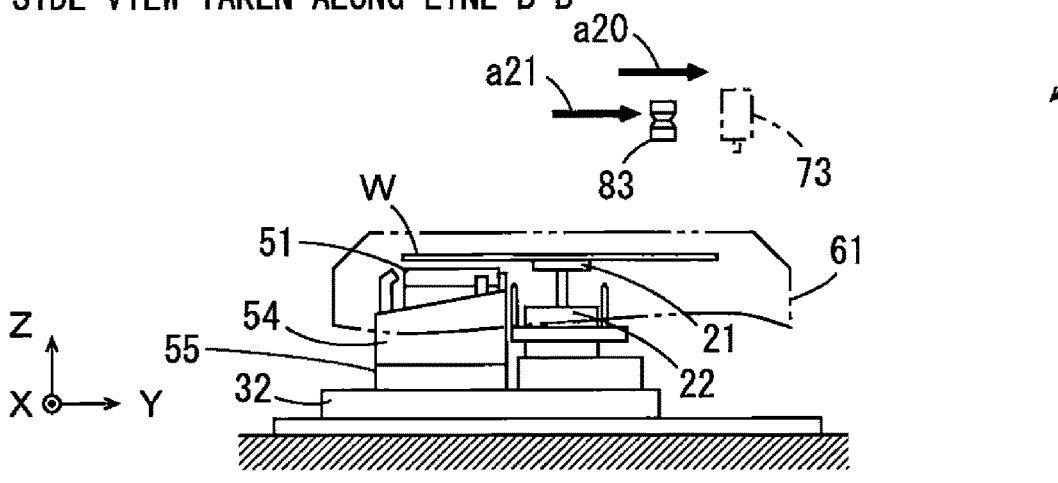

F I G. 1 6
PLAN VIEW
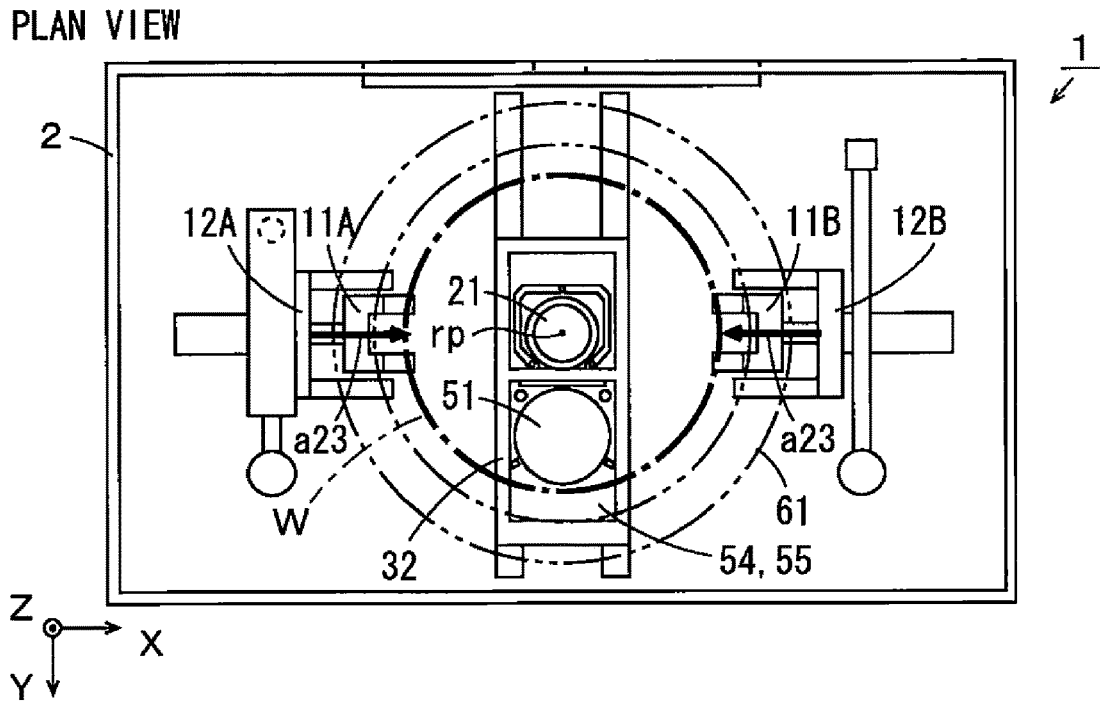
SIDE VIEW TAKEN ALONG LINE A–A
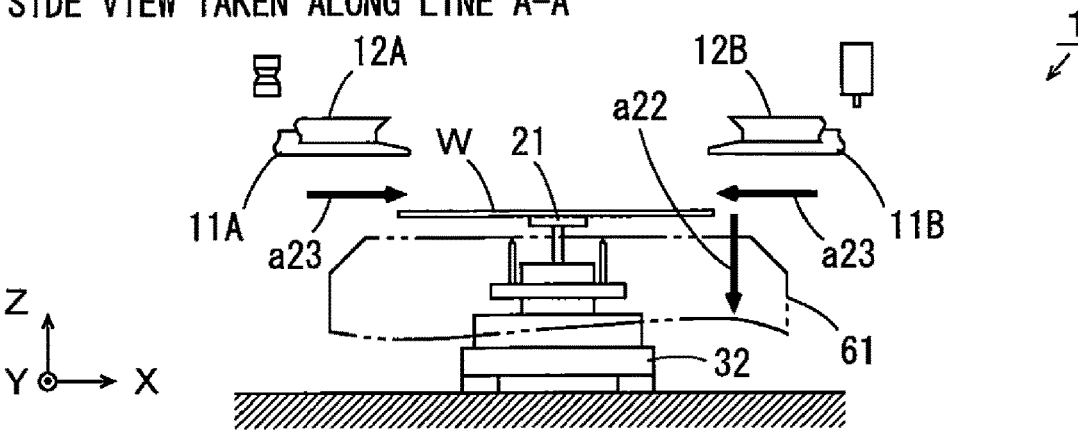
SIDE VIEW TAKEN ALONG LINE B–B
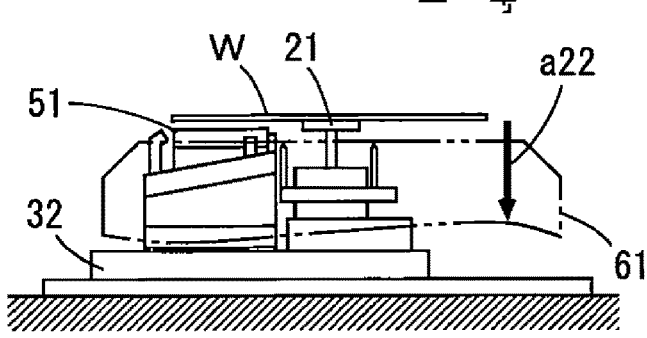

FIG. 17
PLAN VIEW
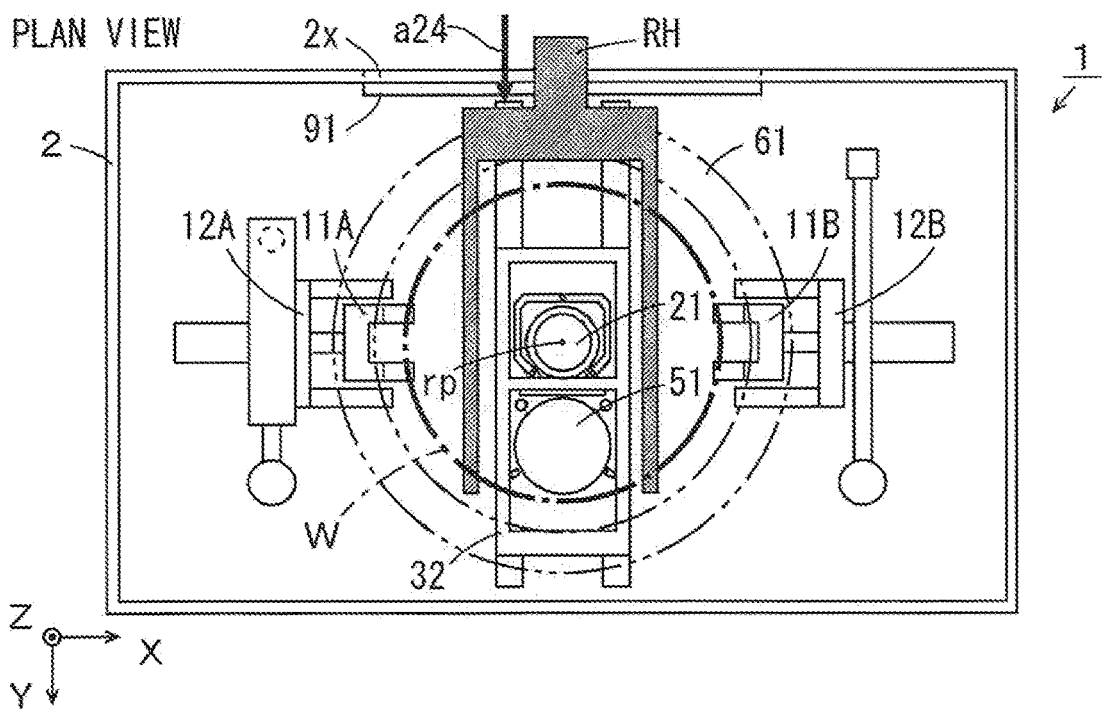
SIDE VIEW TAKEN ALONG LINE A-A
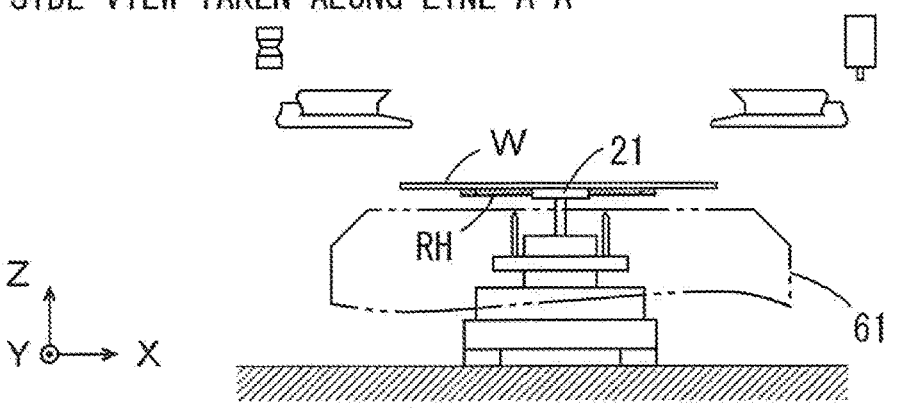
SIDE VIEW TAKEN ALONG LINE B-B
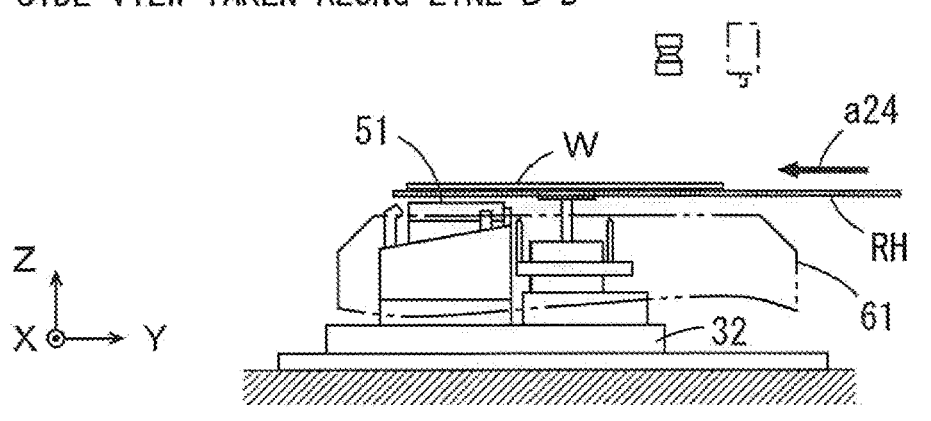

F I G.　1 8
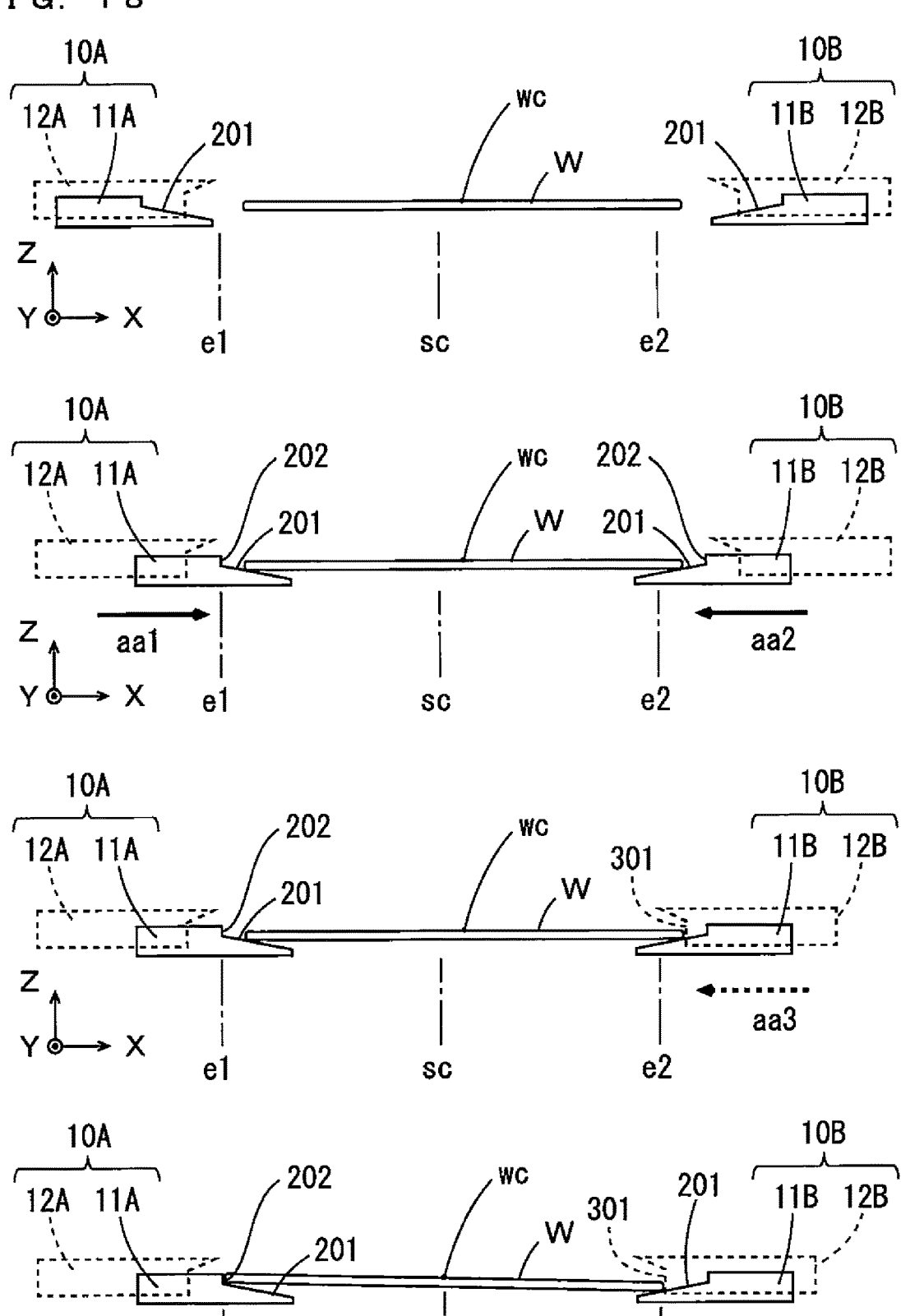

F I G.  1 9
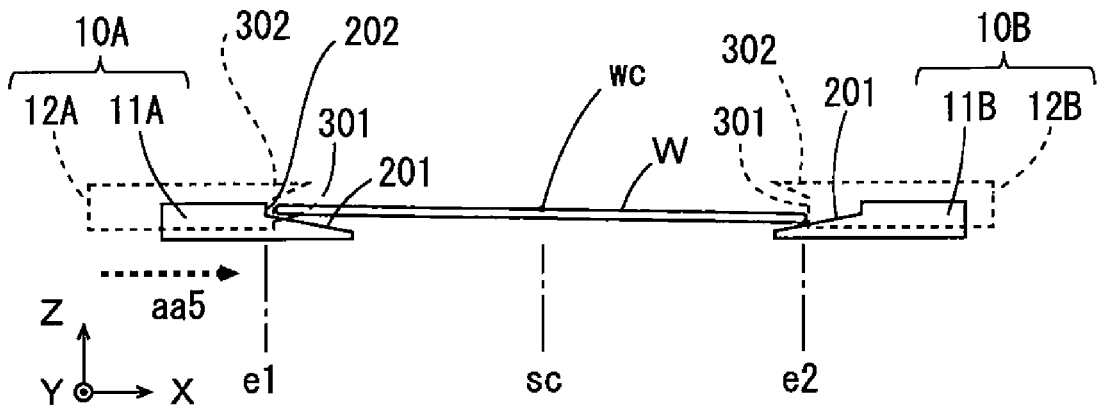
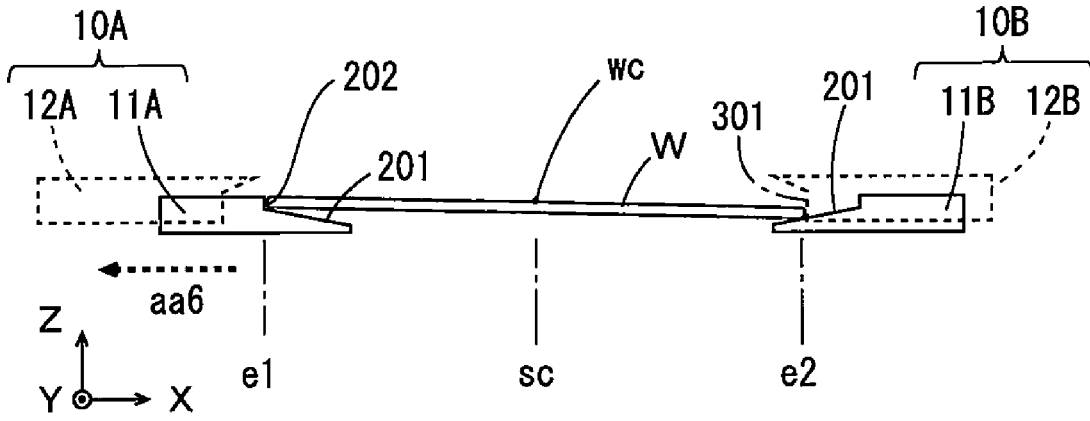
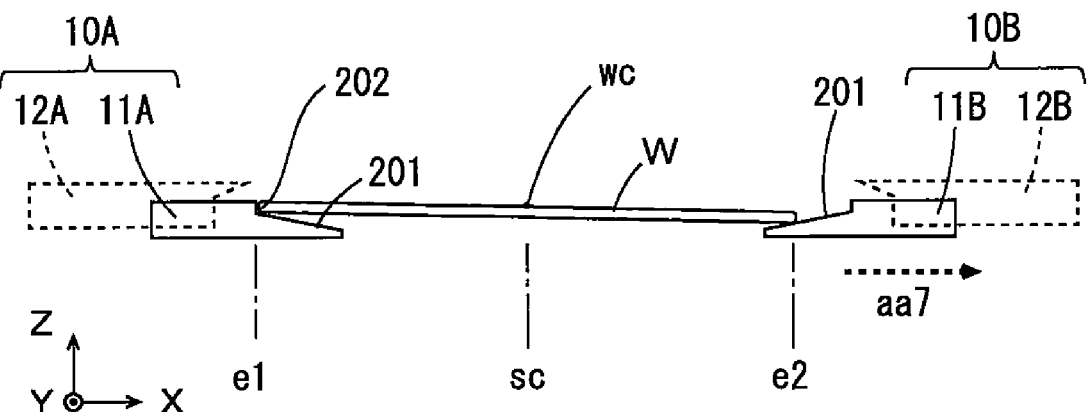

SUBSTRATE ALIGNMENT DEVICE, SUBSTRATE PROCESSING APPARATUS, SUBSTRATE ALIGNMENT METHOD AND SUBSTRATE PROCESSING METHOD

BACKGROUND

Technical Field

The present invention relates to a substrate alignment device, a substrate processing apparatus, a substrate alignment method and a substrate processing method.

Description of Related Art

A substrate processing apparatus is used to perform various processes on various substrates such as a substrate for an FPD (Flat Panel Display) that is used for a liquid crystal display device, an organic EL (Electro Luminescence) display device or the like, a semiconductor substrate, a substrate for an optical disc, a substrate for a magnetic disc, a substrate for a magneto-optical disc, a substrate for a photomask, a ceramic substrate or a substrate for a solar cell. A substrate cleaning device is used to clean a substrate.

For example, a substrate cleaning device described in JP 5904169 B2 includes two suction pads for holding a back-surface peripheral portion of a wafer, a spin chuck for holding a back-surface center portion of the wafer and a brush for cleaning a back surface of the wafer. The two suction pads hold the wafer and move in a transverse direction. In this state, the back-surface center portion of the wafer is cleaned by the brush. Thereafter, the spin chuck receives the wafer from the suction pads. Further, the spin chuck rotates about an axis (rotation shaft) extending in a vertical direction while holding the back-surface center portion of the wafer. In this state, the back-surface peripheral portion of the wafer is cleaned by the brush.

SUMMARY

In the above-mentioned substrate cleaning device, in a case in which not being accurately aligned when being transferred from the suction pads to the spin chuck, the wafer is held by suction by the spin chuck with the center of the wafer deviated from the rotation shaft. In this case, a substrate rotates while being eccentric during rotation of the spin chuck. Thus, an air flow around the rotating substrate is disturbed. Further, the contact state of the brush with respect to the back-surface peripheral portion of the wafer changes in accordance with the rotation angle of the wafer. In these cases, it is difficult to uniformly clean the back-surface peripheral portion of the wafer. Therefore, when the wafer is placed on the spin chuck, it is required to position the wafer with respect to the spin chuck with high accuracy.

An object of the present invention is to provide a substrate alignment device, a substrate processing apparatus, a substrate alignment method and a substrate processing method that enable accurate positioning of a substrate at a predetermined position.

(1) A substrate alignment device according to one aspect of the present invention that aligns a substrate, includes first and second support members that are arranged to be opposite to each other and be spaced apart from each other in a plan view, and respectively support an outer peripheral end of the substrate from a position below the substrate, a first pressing member that is arranged to be opposite to the first support member in a plan view, and moves the substrate on the first and second support members by pressing one portion of the outer peripheral end of the substrate in a first direction directed from the second support member toward the first support member with the substrate supported by the first and second support members, and a first pressing driver that drives the first pressing member, wherein the first support member includes a movement limiter that limits movement of the substrate in the first direction past a predetermined prescribed position.

In the substrate alignment device, the outer peripheral end of the substrate is supported from a position below the substrate by the first and second support members. In this state, the first pressing member presses the substrate in the first direction. Thus, the substrate moves in the first direction on the first and second support members. At this time, the movement of the substrate is limited by the movement limiter such that the substrate does not go past the prescribed position.

As a result, the prescribed position is appropriately defined in accordance with the size of the substrate, so that the substrate supported on the first and second support members can be positioned at a predetermined position with high accuracy.

(2) The first support member may have a first inclined support surface that is capable of supporting the outer peripheral end of the substrate and extends obliquely downwardly toward the second support member, and the second support member may have a second inclined support surface that is capable of supporting the outer peripheral end of the substrate and extends obliquely downwardly toward the first support member.

In this case, when the substrate is supported on the first and second support members, the contact area between the first and second support members, and the substrate can be reduced. Therefore, an amount of contaminants or the like to be transferred is reduced, and a degree of degradation of cleanliness of the substrate is reduced.

(3) Each of the first and second support members may be configured to be movable in a direction parallel to the first direction, and the substrate alignment device may further include a first support driver that drives the first support member, and a second support driver that drives the second support member.

In this case, it is possible to smoothly move the substrate supported by the first and second support members to a position below the first and second support members by suitably adjusting the distance between the first support member and the second support member. Further, because the distance between the first and second support members can be adjusted in accordance with the size of the substrate, the size range the substrate that can be aligned is increased.

(4) The substrate alignment device may further include a second pressing member that is arranged to be opposite to the second support member in a plan view, and presses another portion of the outer peripheral end of the substrate in a second direction opposite to the first direction with the substrate supported by the first and second support members and the one portion of the substrate pressed by the first pressing member, and a second pressing driver that drives the second pressing member.

In this case, because the substrate is firmly fixed between the first pressing member and the second pressing member, a predetermined process can be appropriately performed on the fixed substrate.

(5) Each of the first and second pressing members may be configured to be movable in the first direction and the second direction. In this case, it is possible to easily switch between a state in which the substrate is firmly fixed and a state in which the substrate is not firmly fixed by suitably adjusting the distance between the first pressing member and the second pressing member. Further, the distance between the first and second pressing members can be adjusted in accordance with the size of the substrate. Therefore, the size range of the substrate that can be fixed between the first pressing member and the second pressing member is increased.

(6) The second pressing driver may drive the second pressing member such that, after the second pressing member presses the other portion of the substrate in the second direction, the second pressing member is spaced apart from the other portion before the first pressing member is spaced apart from the one portion of the substrate.

In this case, the second pressing member is spaced apart from the other portion of the substrate, so that only a pressing force is applied by the first pressing member to the substrate. Thus, the substrate moves in the first direction. In this state, the movement of the substrate is limited by the movement limiter such that the substrate does not go past the prescribed position. Therefore, even after being fixed by the first and second pressing members, the substrate can be easily positioned at a predetermined position with high accuracy.

(7) The first pressing member may include a first abutment surface that comes into contact with the one portion of the substrate, and a first upper-end projection that projects in the first direction from an upper end of the first abutment surface, and the second pressing member may include a second abutment surface that comes into contact with the other portion of the substrate, and a second upper-end projection that projects in the second direction from an upper end of the second abutment surface.

In a case in which the one portion and the other portion of the substrate are simultaneously pressed by the first and second pressing members, the substrate may be deformed. Even in such a case, the one portion of the substrate is held between the second support member and the first upper-end projection of the first pressing member. Further, the other portion of the substrate is held between the first support member and the second upper-end projection of the second pressing member. Therefore, movement of the substrate out of the position between the first and second pressing members is suppressed.

(8) A substrate processing apparatus according to another aspect of the present invention includes the above-mentioned substrate alignment device. Thus, the substrate can be appropriately processed.

(9) A substrate alignment method according to yet another aspect of the present invention of aligning a substrate, includes respectively supporting an outer peripheral end of the substrate from a position below the substrate using first and second support members by placing the substrate on the first and second support members that are arranged to be opposite to each other and spaced apart from each other in a plan view, moving the substrate on the first and second support members by pressing one portion of the outer peripheral end of the substrate in a first direction directed from the second support member toward the first support member using a first pressing member arranged to be opposite to the first support member in a plan view with the substrate supported by the first and second support members, and limiting movement of the substrate in the first direction past a predetermined prescribed position using a movement limiter provided at the first support member when the substrate moves on the first and second support members.

With the substrate alignment method, the outer peripheral end of the substrate is supported from a position below the substrate by the first and second support members. In this state, the first pressing member presses the substrate in the first direction. Thus, the substrate moves in the first direction on the first and second support members. At this time, the movement of the substrate is limited by the movement limiter such that the substrate does not go past the prescribed position.

As a result, the prescribed position is appropriately defined in accordance with the size of the substrate, so that the substrate supported on the first and second support members can be positioned at a predetermined position with high accuracy.

(10) The substrate alignment method may further include moving each of the first and second support members in a direction parallel to the first direction. In this case, it is possible to smoothly move the substrate supported by the first and second support members to a position below the first and second support members by suitably adjusting the distance between the first support member and the second support member. Further, because the distance between the first and second support members can be adjusted in accordance with the size of the substrate, the size range of the substrate that can be aligned is increased.

(11) The substrate alignment method may further include pressing another portion of the outer peripheral end of the substrate in a second direction opposite to the first direction using a second pressing member arranged to be opposite to the second support member in a plan view with the substrate supported by the first and second support members and the one portion of the substrate pressed by the first pressing member.

In this case, because the substrate is firmly fixed between the first pressing member and the second pressing member, a predetermined process can be appropriately performed on the fixed substrate.

(12) The substrate alignment method may further include moving each of the first and second pressing members in the first direction and the second direction.

In this case, it is possible to easily switch between a state in which the substrate is firmly fixed and a state in which the substrate is not firmly fixed by suitably adjusting the distance between the first pressing member and the second pressing member. Further, the distance between the first and second pressing members can be adjusted in accordance with the size of the substrate. Therefore, the size range of the substrate that can be fixed between the first pressing member and the second pressing member is increased.

(13) The substrate alignment method may further include, after the second pressing member presses the other portion of the substrate in the second direction, causing the second pressing member to be spaced apart from the other portion before the first pressing member is spaced apart from the one portion of the substrate.

In this case, the second pressing member is spaced apart from the other portion of the substrate, so that only a pressing force is applied by the first pressing member to the substrate. Thus, the substrate moves in the first direction. In this state, the movement of the substrate is limited by the movement limiter such that the substrate does not go past the prescribed position. Therefore, even after being fixed by the first and second pressing members, the substrate can be easily positioned at a predetermined position with high accuracy.

(14) A substrate processing method according to yet another aspect of the present invention includes the above-mentioned substrate alignment method. Thus, the substrate can be appropriately processed.

Other features, elements, characteristics, and advantages of the present disclosure will become more apparent from the following description of preferred embodiments of the present disclosure with reference to the attached drawings.

BRIEF DESCRIPTION OF THE DRAWING

FIG. 1 is a schematic plan view of a substrate cleaning device according to one embodiment of the present invention;

FIG. 2 is an external perspective view showing the inner configuration of the substrate cleaning device of FIG. 1;

FIG. 3 is an external perspective view of the lower chucks of in FIGS. 1 and 2;

FIG. 4 is an external perspective view of the upper chucks of FIGS. 1 and 2;

FIG. 5 is a block diagram showing the configuration of a control system of the substrate cleaning device;

FIG. 6 is a schematic diagram for explaining the schematic operation of the substrate cleaning device of FIG. 1;

FIG. 7 is a schematic diagram for explaining the schematic operation of the substrate cleaning device of FIG. 1;

FIG. 8 is a schematic diagram for explaining the schematic operation of the substrate cleaning device of FIG. 1;

FIG. 9 is a schematic diagram for explaining the schematic operation of the substrate cleaning device of FIG. 1;

FIG. 10 is a schematic diagram for explaining the schematic operation of the substrate cleaning device of FIG. 1;

FIG. 11 is a schematic diagram for explaining the schematic operation of the substrate cleaning device of FIG. 1;

FIG. 12 is a schematic diagram for explaining the schematic operation of the substrate cleaning device of FIG. 1;

FIG. 13 is a schematic diagram for explaining the schematic operation of the substrate cleaning device of FIG. 1;

FIG. 14 is a schematic diagram for explaining the schematic operation of the substrate cleaning device of FIG. 1;

FIG. 15 is a schematic diagram for explaining the schematic operation of the substrate cleaning device of FIG. 1;

FIG. 16 is a schematic diagram for explaining the schematic operation of the substrate cleaning device of FIG. 1;

FIG. 17 is a schematic diagram for explaining the schematic operation of the substrate cleaning device of FIG. 1;

FIG. 18 is a schematic side view for explaining the details of the operation of holding a substrate and the operation of releasing the substrate performed by the upper holding devices; and FIG. 19 is a schematic side view for explaining the details of the operation of holding the substrate and the operation of releasing the substrate performed by the upper holding devices.

DETAILED DESCRIPTION

A substrate alignment device, a substrate processing apparatus, a substrate alignment method and a substrate processing method according to embodiments of the present invention will be described below with reference to the drawings. In the following description, a substrate refers to a semiconductor substrate, a substrate for an FPD (Flat Panel Display) such as a liquid crystal display device or an organic EL (Electro Luminescence) display device, a substrate for an optical disc, a substrate for a magnetic disc, a substrate for a magneto-optical disc, a substrate for a photomask, a ceramic substrate, a substrate for a solar cell, or the like. Further, as for a substrate to be used in the present embodiment, at least part of the substrate has a circular outer periphery. For example, the outer periphery except for a notch for positioning is circular. Further, in the following description, a substrate cleaning device that cleans a substrate will be described as one example of the substrate processing apparatus including the substrate alignment device of the present invention.

1. Configuration of Substrate Cleaning Device

FIG. 1 is a schematic plan view of a substrate cleaning device according to one embodiment of the present invention. FIG. 2 is an external perspective view showing the inner configuration of the substrate cleaning device 1 of FIG. 1. In the substrate cleaning device 1 according to the present embodiment, X, Y and Z directions orthogonal to one another are defined for the clarity of a positional relationship. In FIG. 1 and the subsequent drawings, the X, Y and Z directions are suitably indicated by arrows. The X and Y directions are orthogonal to each other within a horizontal plane, and the Z direction corresponds to a vertical direction.

As shown in FIG. 1, the substrate cleaning device 1 includes upper holding devices 10A, 10B, a lower holding device 20, a base device 30, a receiving-transferring device 40, a lower-surface cleaning device 50, a cup device 60, an upper-surface cleaning device 70, an end-portion cleaning device 80 and an opening-closing device 90. These constituent elements are provided in a unit casing 2. In FIG. 2, the unit casing 2 is indicated by the dotted lines.

The unit casing 2 has a rectangular bottom surface portion 2a, and four sidewall portions 2b, 2c, 2d, 2e extending upwardly from the four sides of the bottom surface portion 2a. The sidewall portions 2b, 2c are opposite to each other, and the sidewall portions 2d, 2e are opposite to each other. A rectangular opening is formed in the center portion of the sidewall portion 2b. This opening is an inlet-outlet port 2x for a substrate W and is used when the substrate W is carried into and carried out from the unit casing 2. In FIG. 2, the inlet-outlet port 2x is indicated by the thick dotted lines. In the following description, a direction directed outwardly of the unit casing 2 in the Y direction from the inside of the unit casing 2 through the inlet-outlet port 2x (the direction directed from the sidewall portion 2c toward the sidewall portion 2b) is referred to as forward, and its opposite direction (the direction directed from the sidewall portion 2b toward the sidewall portion 2c) is referred to as rearward.

The opening-closing device 90 is provided in a portion in which the inlet-outlet port 2x is formed and its vicinal region in the sidewall portion 2b. The opening-closing device 90 includes a shutter 91 that is configured to be capable of opening and closing the inlet-outlet port 2x and a shutter driver 92 that drives the shutter 91. In FIG. 2, the shutter 91 is indicated by the thick two-dots and dash lines. The shutter driver 92 drives the shutter 91 to open the inlet-outlet port 2x when a substrate W is carried into and carried out from the substrate cleaning device 1. Further, the shutter driver 92 drives the shutter 91 to close the inlet-outlet port 2x when a substrate W is cleaned in the substrate cleaning device 1.

The base device 30 is provided in the center portion of the bottom surface portion 2a. The base device 30 includes linear guides 31, a mobile base 32 and a base driver 33. The linear guides 31 include two rails and are provided to extend in the Y direction from positions in the vicinity of the sidewall portion 2b to positions in the vicinity of the sidewall portion 2c in a plan view. The mobile base 32 is provided to be movable in the Y direction on the two rails of the linear guides 31. The base driver 33 includes a pulse motor, for example, and moves the mobile base 32 in the Y direction on the linear guides 31.

The lower holding device 20 and the lower-surface cleaning device 50 are provided on the mobile base 32 to be arranged in the Y direction. The lower holding device 20 includes a suction holder 21 and a suction holding driver 22. The suction holder 21 is a so-called spin chuck, has a circular suction surface that can hold a lower surface of a substrate W by suction and is configured to be rotatable about an axis extending in the up-and-down direction (the axis extending in the Z direction). In the following description, a region that is to be sucked by the suction surface of the suction holder 21 in the lower surface of a substrate W when the substrate W is held by suction by the suction holder 21 is referred to as a lower-surface center region. On the other hand, a region, surrounding the lower-surface center region, in the lower surface of a substrate W is referred to as a lower-surface outer region.

The suction holding driver 22 includes a motor. The motor of the suction holding driver 22 is provided on the mobile base 32 such that its rotation shaft projects upwardly. The suction holder 21 is provided at the upper end portion of the rotation shaft of the suction holding driver 22. Further, in the rotation shaft of the suction holding driver 22, a suction path for holding a substrate W by suction in the suction holder 21 is formed. The suction path is connected to a suction device (not shown). The suction holding driver 22 rotates the suction holder 21 about the above-mentioned rotation shaft.

On the mobile base 32, the receiving-transferring device 40 is further provided in the vicinity of the lower holding device 20. The receiving-transferring device 40 includes a plurality (three in the present example) of support pins 41, a pin coupling member 42 and a pin lifting-lowering driver 43. The pin coupling member 42 is formed to surround the suction holder 21 in a plan view and couples the plurality of support pins 41 to one another. The plurality of support pins 41 extend upwardly by a certain length from the pin coupling member 42 while being coupled to one another by the pin coupling member 42. The pin lifting-lowering driver 43 lifts or lowers the pin coupling member 42 on the mobile base 32. Thus, the plurality of support pins 41 are lifted or lowered relative to the suction holder 21.

The lower-surface cleaning device 50 includes a lower-surface brush 51, two liquid nozzles 52, a gas injector 53, a lifting-lowering supporter 54, a movement supporter 55, a lower-surface brush rotation driver 55a, a lower-surface brush lifting-lowering driver 55b and a lower-surface brush movement driver 55c. The movement supporter 55 is provided to be movable in the Y direction with respect to the lower holding device 20 in a certain region on the mobile base 32. As shown in FIG. 2, the lifting-lowering supporter 54 is provided on the movement supporter 55 to be liftable and lowerable. The lifting-lowering supporter 54 has an upper surface 54u that is inclined downwardly in a direction away from the suction holder 21 (rearwardly in the present example).

As shown in FIG. 1, the lower-surface brush 51 has a circular outer shape in a plan view and is formed to be relatively large in the present embodiment. Specifically, the diameter of the lower-surface brush 51 is larger than the diameter of the suction surface of the suction holder 21 and is 1.3 times of the diameter of the suction surface of the suction holder 21, for example. Further, the diameter of the lower-surface brush 51 is larger than ⅓ of the diameter of a substrate W and smaller than ½ of the diameter of a substrate W. The diameter of a substrate W is 300 mm, for example.

The lower-surface brush 51 has a cleaning surface that can come into contact with the lower surface of a substrate W. Further, the lower-surface brush 51 is attached to the upper surface 54u of the lifting-lowering supporter 54 such that the cleaning surface is directed upwardly and the cleaning surface is rotatable about an axis extending in the up-and-down direction through the center of the cleaning surface.

Each of the two liquid nozzles 52 is attached to the upper surface 54u of the lifting-lowering supporter 54 to be located in the vicinity of the lower-surface brush 51. Further, each of the two liquid nozzles 52 is attached to the upper surface 54u such that a liquid discharge port is directed upwardly. A lower-surface cleaning liquid supplier 56 (FIG. 5) is connected to the liquid nozzles 52. The lower-surface cleaning liquid supplier 56 supplies a cleaning liquid to the liquid nozzles 52. When a substrate W is cleaned by the lower-surface brush 51, the liquid nozzles 52 discharge the cleaning liquid supplied from the lower-surface cleaning liquid supplier 56 to the lower surface of the substrate W. In the present embodiment, pure water is used as the cleaning liquid to be supplied to the liquid nozzles 52.

The gas injector 53 is a slit-like gas injection nozzle having a gas injection port extending in one direction. The gas injector 53 is attached to the upper surface 54u of the lifting-lowering supporter 54 to be located between the lower-surface brush 51 and the suction holder 21 in a plan view. Further, the gas injector 53 is attached to the upper surface 54u of the lifting-lowering supporter 54 such that a gas injection port is directed upwardly. An injection gas supplier 57 (FIG. 5) is connected to the gas injector 53. The injection gas supplier 57 supplies gas to the gas injector 53. In the present embodiment, an inert gas such as a nitrogen gas is used as the gas to be supplied to the gas injector 53. The gas injector 53 injects the gas supplied from the injection gas supplier 57 to the lower surface of a substrate W during cleaning of the substrate W by the lower-surface brush 51 and during drying of the lower surface of a substrate W, as described below. In this case, a strip-shaped gas curtain extending in the X direction is formed between the lower-surface brush 51 and the suction holder 21.

The lower-surface brush rotation driver 55a includes a motor, and rotates the lower-surface brush 51 during cleaning of a substrate W by the lower-surface brush 51. The lower-surface brush lifting-lowering driver 55b includes a stepping motor or an air cylinder, and lifts or lowers the lifting-lowering supporter 54 with respect to the movement supporter 55. The lower-surface brush movement driver 55c includes a motor, and moves the movement supporter 55 in the Y direction on the mobile base 32. Here, the position of the lower holding device 20 in the mobile base 32 is fixed. Therefore, when being moved by the lower-surface brush movement driver 55c in the Y direction, the movement supporter 55 is moved relative to the lower holding device 20. In the following description, the position of the lower-surface cleaning device 50 being located closest to the lower holding device 20 on the mobile base 32 is referred to as a proximal position, and the position of the lower-surface cleaning device 50 located farthest from the lower holding device 20 on the mobile base 32 is referred to as a distal position.

The cup device 60 is further provided in the center portion of the bottom surface portion 2a. The cup device 60 includes a cup 61 and a cup driver 62. The cup 61 is provided to surround the lower holding device 20 and the base device 30 in a plan view, and be liftable and lowerable. In FIG. 2, the cup 61 is indicated by the dotted lines. The cup driver 62 moves the cup 61 between a lower cup position and an upper cup position in accordance with which portion of the lower surface of a substrate W is to be cleaned by the lower-surface brush 51. The lower cup position is a height position at which the upper end portion of the cup 61 is located farther downwardly than a substrate W held by suction by the suction holder 21. Further, the upper cup position is a height position at which the upper end portion of the cup 61 is located farther upwardly than the suction holder 21.

At height positions farther upward than the cup 61, the pair of upper holding devices 10A, 10B is provided to be opposite to each other with the base device 30 held therebetween in a plan view. The upper holding device 10A includes a lower chuck 11A, an upper chuck 12A, a lower chuck driver 13A and an upper chuck driver 14A. The upper holding device 10B includes a lower chuck 11B, an upper chuck 12B, a lower chuck driver 13B and an upper chuck driver 14B. The upper holding devices 10A, 10B constitute the substrate alignment device of the present invention.

FIG. 3 is an external perspective view of the lower chucks 11A, 11B shown in FIGS. 1 and 2. In FIG. 3, the lower chucks 11A, 11B are indicated by the thick solid lines. Further, the upper chucks 12A, 12B are indicated by the dotted lines. In the external perspective view of FIG. 3, the expansion and contraction rates of each component are different from those in FIG. 2 in order to facilitate understanding of the shape of the lower chucks 11A, 11B.

As shown in FIG. 3, the lower chucks 11A, 11B are arranged symmetrically with respect to a vertical plane extending in the Y direction (the front-and-rear direction) through the center of the suction holder 21 in a plan view, and are provided to be movable in the X direction in a common horizontal plane. Each of the lower chucks 11A, 11B has two support pieces 200. Each support piece 200 is provided with an inclined support surface 201 and a movement limiting surface 202.

In the lower chuck 11A, the inclined support surface 201 of each support piece 200 is formed so as to be capable of supporting the outer peripheral end of a substrate W from below and extend obliquely downwardly toward the lower chuck 11B. The movement limiting surface 202 extends upwardly from the upper end of the inclined support surface 201 to generate a level difference at the upper end of the lower chuck 11A. On the other hand, in the lower chuck 11B, the inclined support surface 201 of each support piece 200 is formed so as to be capable of supporting the outer peripheral end of a substrate W from below and extend obliquely downwardly toward the lower chuck 11A. The movement limiting surface 202 extends upwardly from the upper end of the inclined support surface 201 to generate a level difference at the upper end of the lower chuck 11B.

The lower chuck drivers 13A, 13B include air cylinders or motors as actuators. The lower chuck drivers 13A, 13B move the lower chucks 11A, 11B such that the lower chucks 11A, 11B are closer to each other or are farther away from each other. Here, in a case in which target positions of the lower chucks 11A, 11B in the X direction are predetermined, the lower chuck drivers 13A, 13B can individually adjust the positions of the lower chucks 11A, 11B in the X direction based on the information about the target positions. For example, it is possible to place a substrate W on the plurality of inclined support surfaces 201 of the lower chucks 11A, 11B by making the distance between the lower chucks 11A, 11B be smaller than the outer diameter of the substrate W. In this case, the outer peripheral end of the substrate W is supported by each inclined support surface 201.

FIG. 4 is an external perspective view of the upper chucks 12A, 12B of FIGS. 1 and 2. In FIG. 4, the upper chucks 12A, 12B are indicated by the thick solid lines. Further, the lower chucks 11A, 11B are indicated by the dotted lines. In the external perspective view of FIG. 4, the expansion and contraction rates of each component are different from those in the external perspective view of FIG. 2 in order to facilitate understanding of the shape of the upper chucks 12A, 12B.

As shown in FIG. 4, similarly to the lower chucks 11A, 11B, the upper chucks 12A, 12B are arranged symmetrically with respect to the vertical plane extending in the Y direction (the front-and-rear direction) through the center of the suction holder 21 in a plan view, and are provided to be movable in the X direction in a common horizontal plane. Each of the upper chucks 12A, 12B has two holding pieces 300. Each holding piece 300 has an abutment surface 301 and a projection 302.

In the upper chuck 12A, the abutment surface 301 of each holding piece 300 is formed so as to face the upper chuck 12B at the lower portion of the tip of the holding piece 300, and is orthogonal to the X direction. The projection 302 is formed so as to project from the upper end of the abutment surface 301 toward the upper chuck 12B by a predetermined distance. On the other hand, in the upper chuck 12B, the abutment surface 301 of each holding piece 300 is formed so as to face the upper chuck 12A at the lower portion of the tip of the holding piece 300, and is orthogonal to the X direction. The projection 302 is formed so as to project from the upper end of the abutment surface 301 toward the upper chuck 12A by a predetermined distance.

The upper chuck drivers 14A, 14B include air cylinders or motors as actuators. The upper chuck drivers 14A, 14B move the upper chucks 12A, 12B such that the upper chucks 12A, 12B are closer to each other or farther away from each other. Here, in a case in which target positions of the upper chucks 12A, 12B in the X direction are predetermined, the upper chuck drivers 14A, 14B can individually adjust the positions of the upper chucks 12A, 12B in the X direction based on the information about the target positions.

In the above-mentioned upper holding devices 10A, 10B, the upper chucks 12A, 12B are moved toward the outer peripheral end of a substrate W supported by the lower chucks 11A, 11B. The two abutment surfaces 301 of the upper chuck 12A and the two abutment surfaces 301 of the upper chuck 12B come into contact with a plurality of portions of the outer peripheral end of a substrate W, whereby the outer peripheral end of the substrate W is held and the substrate W is firmly fixed. Details of an operation of holding a substrate W and an operation of releasing a held substrate W in the upper holding devices 10A, 10B will be described below.

As shown in FIG. 1, at a position near one side of the cup 61, the upper-surface cleaning device 70 is provided to be located in the vicinity of the upper holding device 10B in a plan view. The upper-surface cleaning device 70 includes a rotation support shaft 71, an arm 72, a spray nozzle 73 and an upper-surface cleaning driver 74.

The rotation support shaft 71 is supported on the bottom surface portion 2a by the upper-surface cleaning driver 74 to extend in the up-and-down direction, and to be liftable, lowerable and rotatable. As shown in FIG. 2, at a position farther upward than the upper holding device 10B, the arm 72 is provided to extend in the horizontal direction from the upper end portion of the rotation support shaft 71. The spray nozzle 73 is attached to the tip portion of the arm 72.

An upper-surface cleaning fluid supplier 75 (FIG. 5) is connected to the spray nozzle 73. The upper-surface cleaning fluid supplier 75 supplies a cleaning liquid and gas to the spray nozzle 73. In the present embodiment, pure water is used as the cleaning liquid to be supplied to the spray nozzle 73, and an inert gas such as a nitrogen gas is used as the gas to be supplied to the spray nozzle 73. When the upper surface of a substrate W is cleaned, the spray nozzle 73 mixes a cleaning liquid and gas supplied from the upper-surface cleaning fluid supplier 75 to produce a fluid mixture, and injects the produced fluid mixture downwardly.

The upper-surface cleaning driver 74 includes one or a plurality of pulse motors, an air cylinder and the like, lifts or lowers the rotation support shaft 71 and rotates the rotation support shaft 71. With the above-mentioned configuration, on the upper surface of a substrate W held by suction and rotated by the suction holder 21, the spray nozzle 73 is moved in a circular arc shape. Thus, the entire upper surface of the substrate W can be cleaned.

As shown in FIG. 1, at a position near the other side of the cup 61, the end-portion cleaning device 80 is provided to be located in the vicinity of the upper holding device 10A in a plan view. The end-portion cleaning device 80 includes a rotation support shaft 81, an arm 82, a bevel brush 83 and a bevel brush driver 84.

The rotation support shaft 81 is supported on the bottom surface portion 2a by the bevel brush driver 84 to extend in the up-and-down direction and to be liftable, lowerable and rotatable. As shown in FIG. 2, at a position farther upward than the upper holding device 10A, the arm 82 is provided to extend in the horizontal direction from the upper end portion of the rotation support shaft 81. At the tip portion of the arm 82, the bevel brush 83 is provided to project downwardly and to be rotatable about an axis extending in the up-and-down direction.

In the bevel brush 83, its upper half portion has an inverse trapezoidal shape, and its lower half portion has a trapezoidal shape. With this bevel brush 83, the outer peripheral end of a substrate W can be cleaned by the center portion in the up-and-down direction of the outer peripheral surface.

The bevel brush driver 84 includes one or a plurality of pulse motors, an air cylinder and the like, lifts or lowers the rotation support shaft 81 and rotates the rotation support shaft 81. With the above-mentioned configuration, the center portion of the outer peripheral surface of the bevel brush 83 is brought into contact with the outer peripheral end of a substrate W held by suction and rotated by the suction holder 21. Thus, the entire outer peripheral end of the substrate W can be cleaned.

Here, the bevel brush driver 84 further includes a motor built in the arm 82. The motor rotates the bevel brush 83 provided at the tip portion of the arm 82 about the axis extending in the up-and-down direction. Therefore, when the outer peripheral end of a substrate W is cleaned, a cleaning force of the bevel brush 83 in the outer peripheral end of the substrate W is improved by rotation of the bevel brush 83.

FIG. 5 is a block diagram showing the configuration of a control system of the substrate cleaning device 1. The control device 9 of FIG. 5 includes a CPU (Central Processing Unit), a RAM (Random Access Memory), a ROM (Read Only Memory) and a storage device. The RAM is used as a work area for the CPU. The ROM stores a system program. The storage device stores a control program.

As shown in FIG. 5, the control device 9 includes a chuck controller 9A, a suction controller 9B, a base controller 9C, a receiving-transferring controller 9D, a lower-surface cleaning controller 9E, a cup controller 9F, an upper-surface cleaning controller 9G, a bevel cleaning controller 9H and a carry-in carry-out controller 9I as functions. The functions of the control device 9 are implemented by execution of a substrate cleaning program stored in the storage device by the CPU. Part or all of the functions of the control device 9 may be implemented by hardware such as an electronic circuit.

The chuck controller 9A controls the lower chuck drivers 13A, 13B and the upper chuck drivers 14A, 14B in order to receive a substrate W that is carried into the substrate cleaning device 1 and hold the substrate W at a position above the suction holder 21. The suction controller 9B controls the suction holding driver 22 in order to hold a substrate W by suction and rotate the substrate W held by suction using the suction holder 21.

The base controller 9C controls the base driver 33 in order to move the mobile base 32 with respect to a substrate W held by the upper holding devices 10A, 10B. The receiving-transferring controller 9D controls the pin lifting-lowering driver 43 in order to move a substrate W between a height position of the substrate W held by the upper holding devices 10A, 10B and a height position of the substrate W held by the suction holder 21.

The lower-surface cleaning controller 9E controls the lower-surface brush rotation driver 55a, the lower-surface brush lifting-lowering driver 55b, the lower-surface brush movement driver 55c, the lower-surface cleaning liquid supplier 56 and the injection gas supplier 57 in order to clean the lower surface of a substrate W. The cup controller 9F controls the cup driver 62 in order to receive the cleaning liquid splashed from a substrate W using the cup 61 when the substrate W held by suction by the suction holder 21 is cleaned.

The upper-surface cleaning controller 9G controls the upper-surface cleaning driver 74 and the upper-surface cleaning fluid supplier 75 in order to clean the upper surface of a substrate W held by suction by the suction holder 21. The bevel cleaning controller 9H controls the bevel brush driver 84 in order to clean the outer peripheral end of a substrate W held by suction by the suction holder 21. The carry-in carry-out controller 9I controls the shutter driver 92 in order to open and close the inlet-outlet port 2x of the unit casing 2 when a substrate W is carried into and carried out from the substrate cleaning device 1.

2. Schematic Operation of Substrate Cleaning Device

FIGS. 6 to 17 are schematic diagrams for explaining the schematic operation of the substrate cleaning device 1 of FIG. 1. In each of FIGS. 6 to 17, a plan view of the substrate cleaning device 1 is shown in the upper field. Further, a side view of the lower holding device 20 and its peripheral portions as viewed in the Y direction is shown in the middle field, and a side view of the lower holding device 20 and its peripheral portions as viewed in the X direction is shown in the bottom field. The side view in the middle field corresponds to the side view of the substrate cleaning device 1 taken along the line A-A of FIG. 1, and the side view in the bottom field corresponds to the side view of the substrate cleaning device 1 taken along the line B-B of FIG. 1. The expansion and contraction rates of part of the constituent elements are different for the plan view in the upper field and the side views in the middle and bottom fields in order to facilitate understanding of the shape and operation state of each constituent element in the substrate cleaning device 1. Further, in each of FIGS. 6 to 17, the cup 61 is indicated by the two-dots and dash lines, and the outer shape of a substrate W is indicated by the thick one-dot and dash lines.

In an initial state before a substrate W is carried into the substrate cleaning device 1, the inlet-outlet port 2x is closed by the shutter 91 of the opening-closing device 90. Further, as shown in FIG. 1, the lower chucks 11A, 11B are maintained in a state in which the distance between the lower chucks 11A, 11B is sufficiently larger than the diameter of a substrate W. Further, the upper chucks 12A, 12B are also maintained in a state in which the distance between the upper chucks 12A, 12B is sufficiently larger than the diameter of a substrate W. Further, the mobile base 32 of the base device 30 is arranged such that the center of the suction holder 21 is located at the center of the cup 61 in a plan view. The lower-surface cleaning device 50 is arranged in the proximal position on the mobile base 32. In the lifting-lowering supporter 54 of the lower-surface cleaning device 50, the cleaning surface (the upper end portion) of the lower-surface brush 51 is located farther downwardly than the suction holder 21.

Further, in the receiving-transferring device 40, the plurality of support pins 41 are located farther downwardly than the suction holder 21. Further, in the cup device 60, the cup 61 is in the lower cup position. In the following description, the center position of the cup 61 in a plan view is referred to as a plane reference position rp. Further, the position of the mobile base 32 located on the bottom surface portion 2a when the center of the suction holder 21 is in the plane reference position rp in a plan view is referred to as a first horizontal position.

A substrate W is carried into the unit casing 2 of the substrate cleaning device 1. Specifically, the shutter 91 opens the inlet-outlet port 2x immediately before the substrate W is carried in. Thereafter, as indicated by the thick solid arrow a1 in FIG. 6, a hand (substrate holder) RH of a substrate transporting robot (not shown) carries the substrate W to the substantially center position in the unit casing 2 through the inlet-outlet port 2x. At this time, the substrate W held by the hand RH is located between the lower chuck 11A and the upper chuck 12A, and the lower chuck 11B and the upper chuck 12B as shown in FIG. 6.

Next, as indicated by the thick solid arrows a2 in FIG. 7, the lower chucks 11A, 11B move closer to each other such that a plurality of support pieces 200 (FIG. 3) of the lower chucks 11A, 11B are located below the lower-surface peripheral portion of the substrate W. In this state, the hand RH is lowered and exits from the inlet-outlet port 2x. Thus, a plurality of portions of the lower-surface peripheral portion of the substrate W held by the hand RH are supported by the plurality of support pieces 200 (FIG. 3) of the lower chucks 11A, 11B. After the hand RH exits, the shutter 91 closes the inlet-outlet port 2x. Details of an operation of the lower chucks 11A, 11B in FIG. 7 will be described below.

Next, as indicated by the thick solid arrows a3 in FIG. 8, the upper chucks 12A, 12B move closer to each other such that the plurality of holding pieces 300 (FIG. 4) of the upper chucks 12A, 12B abut against the outer peripheral end of the substrate W. The plurality of holding pieces 300 (FIG. 4) of the upper chucks 12A, 12B abut against a plurality of portions of the outer peripheral end of the substrate W, whereby the substrate W supported by the lower chucks 11A, 11B is further held by the upper chucks 12A, 12B.

Details of the operation of the upper chucks 12A, 12B in FIG. 8 will be described below.

Further, as indicated by the thick solid arrow a4 in FIG. 8, the mobile base 32 is moved forwardly from the first horizontal position, such that suction holder 21 deviates from the plane reference position rp by a predetermined distance and the center of the lower-surface brush 51 is located at the plane reference position rp. At this time, the position of the mobile base 32 located on the bottom surface portion 2a is referred to as a second horizontal position.

Next, as indicated by the thick solid arrow a5 in FIG. 9, the lifting-lowering supporter 54 is lifted such that the cleaning surface of the lower-surface brush 51 comes into contact with the lower-surface center region of a substrate W. Further, as indicated by the thick solid arrow a6 in FIG. 9, the lower-surface brush 51 is rotated (spins) about the axis extending in the up-and-down direction. Thus, contaminants adhering to the lower-surface center region of the substrate W are physically stripped by the lower-surface brush 51.

In the bottom field in FIG. 9, an enlarged side view of a portion in which the lower-surface brush 51 that are in contact with the lower surface of the substrate W is shown in a balloon. As shown in the balloon, with the lower-surface brush 51 in contact with the substrate W, the liquid nozzle 52 and the gas injector 53 are held at positions close to the lower surface of the substrate W. At this time, as indicated by the outlined arrow a51, the liquid nozzle 52 discharges the cleaning liquid toward the lower surface of the substrate W at a position in the vicinity of the lower-surface brush 51. Thus, the cleaning liquid that has been supplied to the lower surface of the substrate W from the liquid nozzle 52 is guided to the contact portion in which the lower-surface brush 51 and the substrate W are in contact with each other, whereby contaminants that have been removed from the back surface of the substrate W by the lower-surface brush 51 are washed away by the cleaning liquid. In this manner, in the lower-surface cleaning device 50, the liquid nozzle 52 is attached to the lifting-lowering supporter 54 together with the lower-surface brush 51. Thus, the cleaning liquid can be supplied efficiently to a portion to be cleaned in the lower surface of the substrate W by the lower-surface brush 51. Therefore, the consumption of the cleaning liquid is reduced, and excessive splashing of the cleaning liquid is suppressed.

Here, the upper surface 54u of the lifting-lowering supporter 54 is inclined downwardly in a direction away from the suction holder 21. In this case, in a case where the cleaning liquid including contaminants falls on the lifting-lowering supporter 54 from the lower surface of the substrate W, the cleaning liquid received by the upper surface 54u is guided in a direction away from the suction holder 21.

Further, when the lower surface of the substrate W is cleaned by the lower-surface brush 51, the gas injector 53 injects gas toward the lower surface of the substrate W at a position between the lower-surface brush 51 and the suction holder 21 as indicated by the outlined arrow a52 in the balloon of FIG. 9. In the present embodiment, the gas injector 53 is attached onto the lifting-lowering supporter 54 such that the gas injection port extends in the X direction. In this case, when gas is injected to the lower surface of the substrate W from the gas injector 53, a strip-shaped gas curtain extending in the X direction is formed between the lower-surface brush 51 and the suction holder 21. Thus, when the lower surface of the substrate W is cleaned by the lower-surface brush 51, the cleaning liquid including contaminants is prevented from being splashed toward the suction holder 21. Thus, when the lower surface of the substrate W is cleaned by the lower-surface brush 51, the cleaning liquid including contaminants is prevented from adhering to the suction holder 21, and the suction surface of the suction holder 21 is maintained clean.

While the gas injector 53 injects gas obliquely upwardly toward the lower-surface brush 51 from the gas injector 53 as indicated by the outlined arrow a52 in the example of FIG. 9, the present invention is not limited to this. The gas injector 53 may inject gas in the Z direction toward the lower surface of the substrate W from the gas injector 53.

Next, in the state shown in FIG. 9, when the cleaning of the lower-surface center region of the substrate W is completed, the rotation of the lower-surface brush 51 is stopped, and the lifting-lowering supporter 54 is lowered such that the cleaning surface of the lower-surface brush 51 is spaced apart from the substrate W by a predetermined distance. Further, discharging of the cleaning liquid from the liquid nozzle 52 to the substrate W is stopped. At this time, the injection of gas from the gas injector 53 to the substrate W continues.

Thereafter, as indicated by the thick solid arrow a7 in FIG. 10, the mobile base 32 is moved rearwardly such that the suction holder 21 is located at the plane reference position rp. That is, the mobile base 32 is moved from the second horizontal position to the first horizontal position. At this time, injection of gas from the gas injector 53 to the substrate W continues, so that the lower-surface center region of the substrate W is sequentially dried by a gas curtain.

Next, as indicated by the thick solid arrow a8 in FIG. 11, the lifting-lowering supporter 54 is lowered such that the cleaning surface of the lower-surface brush 51 is located farther downwardly than the suction surface (upper end portion) of the suction holder 21. Further, as indicated by the thick solid arrows a9 in FIG. 11, the upper chucks 12A, 12B move away from each other such that the plurality of holding pieces of the upper chucks 12A, 12B are spaced apart from the outer peripheral end of the substrate W. At this time, the substrate W is being supported by the lower chucks 11A, 11B. Details of the operation of the upper chucks 12A, 12B in FIG. 11 will be described below.

Thereafter, as indicated by the thick solid arrow a10 in FIG. 11, the pin coupling member 42 is lifted such that the upper end portions of the plurality of support pins 41 are located slightly farther upwardly than the lower chucks 11A, 11B. Thus, the substrate W supported by the lower chucks 11A, 11B is received by the plurality of support pins 41.

Next, as indicated by the thick solid arrows a11 in FIG. 12, the lower chucks 11A, 11B move away from each other. At this time, the lower chucks 11A, 11B move to positions at which the lower chucks 11A, 11B do not overlap with the substrate W supported by the plurality of support pins 41 in a plan view. Thus, both of the upper holding devices 10A, 10B return to the initial state.

Next, as indicated by the thick solid arrow a12 in FIG. 13, the pin coupling member 42 is lowered such that the upper end portions of the plurality of pins 41 are located farther downwardly than the suction holder 21. Thus, the substrate W supported on the plurality of support pins 41 is received by the suction holder 21. In this state, the suction holder 21 holds the lower-surface center region of the substrate W by suction. At the same time as the pin coupling member 42 is lowered or after the pin coupling member 42 is lowered, the cup 61 is lifted from the lower cup position to the upper cup position as indicated by the thick solid arrow a13 in FIG. 13.

Next, as indicated by the thick solid arrow a14 in FIG. 14, the suction holder 21 rotates about the axis extending in the up-and-down direction (an axial center of the rotation shaft of the suction holding driver 22). Thus, the substrate W held by suction by the suction holder 21 is rotated in a horizontal attitude.

Next, the rotation support shaft 71 of the upper-surface cleaning device 70 is rotated and lowered. Thus, as indicated by the thick solid arrow a15 in FIG. 14, the spray nozzle 73 is moved to a position above the center of the substrate W, and the spray nozzle 73 is lowered such that the distance between the spray nozzle 73 and the substrate W is a predetermined distance. In this state, the spray nozzle 73 injects a fluid mixture of the cleaning liquid and gas to the upper surface of the substrate W. Further, the rotation support shaft 71 is rotated. Thus, as indicated by the thick solid arrow a16 in FIG. 14, the spray nozzle 73 is moved at a position above the rotating substrate W. The fluid mixture is injected to the entire upper surface of the substrate W, so that the entire upper surface of the substrate W is cleaned.

Further, when the upper surface of the substrate W is cleaned by the spray nozzle 73, the rotation support shaft 81 of the end-portion cleaning device 80 is rotated and lowered. Thus, as indicated by the thick solid arrow a17 in FIG. 14, the bevel brush 83 is moved to a position above the outer peripheral end of the substrate W. Further, the bevel brush 83 is lowered such that the center portion of the outer peripheral surface of the bevel brush 83 comes into contact with the outer peripheral end of the substrate W. In this state, the bevel brush 83 is rotated (spins) about the axis extending in the up-and-down direction. Thus, contaminants adhering to the outer peripheral end of the substrate W are physically stripped by the bevel brush 83. The contaminants that have been stripped from the outer peripheral end of the substrate W are washed away by the cleaning liquid of the fluid mixture injected from the spray nozzle 73 to the substrate W.

Further, when the upper surface of the substrate W is cleaned by the spray nozzle 73, the lifting-lowering supporter 54 is lifted such that the cleaning surface of the lower-surface brush 51 comes into contact with the lower-surface outer region of the substrate W. Further, as indicated by the thick solid arrow a18 in FIG. 14, the lower-surface brush 51 is rotated (spins) about the axis extending in the up-and-down direction. Further, the liquid nozzle 52 discharges the cleaning liquid toward the lower surface of the substrate W, and the gas injector 53 injects the gas toward the lower surface of the substrate W. Thus, it is possible to clean the entire lower-surface outer region of the substrate W held by suction and rotated by the suction holder 21 using the lower-surface brush 51.

The rotation direction of the lower-surface brush 51 may be opposite to the rotation direction of the suction holder 21. In this case, the lower-surface outer region of the substrate W can be cleaned efficiently. In a case in which the lower-surface brush 51 is not relatively large, the movement supporter 55 may advance and retreat between the proximal position and the distal position on the mobile base 32 as indicated by the thick solid arrow a19 in FIG. 14. Even in this case, it is possible to clean the entire lower-surface outer region of the substrate W held by suction and rotated by the suction holder 21 using the lower-surface brush 51.

Next, when cleaning of the upper surface, the outer peripheral end and the lower-surface outer region of the substrate W is completed, injection of a fluid mixture from the spray nozzle 73 to the substrate W is stopped. Further, as indicated by the thick solid arrow a20 in FIG. 15, the spray nozzle 73 is moved to a position near one side of the cup 61 (the position in the initial state). Further, as indicated by the thick solid arrow a21 in FIG. 15, the bevel brush 83 is moved to a position near the other side of the cup (the position in the initial state). Further, the rotation of the lower-surface brush 51 is stopped, and the lifting-lowering supporter 54 is lowered such that the cleaning surface of the lower-surface brush 51 is spaced apart from the substrate W by a predetermined distance. Further, the discharging of the cleaning liquid from the liquid nozzle 52 to the substrate W and the injection of gas from the gas injector 53 to the substrate W are stopped. In this state, the suction holder 21 is rotated at a high speed, so that the cleaning liquid adhering to the substrate W is shaken off, and the entire substrate W is dried.

Next, as indicated by the thick solid arrow a22 in FIG. 16, the cup 61 is lowered from the upper cup position to the lower cup position. Further, as indicated by the thick solid arrows a23 in FIG. 16, the lower chucks 11A, 11B move closer to each other to the positions at which the lower chucks 11A, 11B can support a new substrate W in preparation for the new substrate W being carried into the unit casing 2.

Finally, the substrate W is carried out from the unit casing 2 of the substrate cleaning device 1. Specifically, the shutter 91 opens the inlet-outlet port 2x immediately before the substrate W is carried out. Thereafter, as indicated by the thick solid arrow a24 in FIG. 17, the hand (substrate holder) RH of the substrate transporting robot (not shown) enters the unit casing 2 through the inlet-outlet port 2x. Subsequently, the hand RH receives the substrate Won the suction holder 21 and exits from the inlet-outlet port 2x. After the hand RH exits, the shutter 91 closes the inlet-outlet port 2x.

3. Details of Operation of Upper Holding Devices 10A, 10B

In the series of above-mentioned schematic operations, a substrate W is desirably positioned immediately before being transferred from the upper holding devices 10A, 10B to the suction holder 21 such that the center of the substrate W overlaps the rotation shaft of the suction holder 21 (the rotation shaft of the suction holding driver 22) in a plan view. In this case, when the receiving-transferring device 40 transfers a substrate W from the upper holding devices 10A, 10B to the lower holding device 20, the center of the substrate W can be accurately and appropriately positioned on the rotation shaft of the suction holder 21. As such, in the present embodiment, the upper holding devices 10A, 10B are operated based on the control of the chuck controller 9A of FIG. 5 such that the center of the substrate W is positioned on the rotation shaft of the suction holder 21 in a plan view. Details of this operation will be described.

FIGS. 18 and 19 are schematic side views for explaining the details of the operation of holding a substrate W and the operation of releasing a substrate W performed by the upper holding devices 10A, 10B. The plurality of side views of FIGS. 18 and 19 correspond to the side view of the substrate cleaning device 1 taken along the line A-A in FIG. 1, and show the operation states of the upper holding devices 10A, 10B in a chronological order until a substrate W that has been carried into the substrate cleaning device 1 is transferred to the suction holder 21 by the receiving-transferring device 40.

In FIGS. 18 and 19, the lower chucks 11A, 11B of the upper holding devices 10A, 10B are indicated by the solid lines, and the upper chucks 12A, 12B are indicated by the dotted lines. Further, the position, of the straight line extending in the vertical direction through the plane reference position rp, in the X direction is denoted by a symbol sc. The straight line extending in the vertical direction through the plane reference position rp coincides with the straight line extending along the rotation shaft of the suction holder 21 with the mobile base 32 located at the first horizontal position.

Further, the position at which the outer peripheral end of a substrate W is to be supported by the upper holding device 10A in the X direction with the center wc of the substrate W located at the plane reference position rp is denoted by a symbol e1. Further, the position at which the outer peripheral end of a substrate W is to be supported by the upper holding device 10B in the X direction with the center wc of the substrate W located at the plane reference position rp is denoted by a symbol e2. The positions e1, e2 are predetermined based on the design dimensions of each component of the substrate cleaning device 1 and the dimensions of a substrate W such that an excessive load is not applied to the substrate W (to prevent the substrate W from being greatly deformed) with the outer peripheral end of the substrate W supported by the upper holding devices 10A, 10B.

First, as shown in the top diagram in FIG. 18, when a substrate W is carried into the substrate cleaning device 1, the lower chucks 11A, 11B move close to each other as described with reference to FIGS. 6 and 7. At this time, as shown in the second diagram from the top in FIG. 18, the one lower chuck 11A moves in the X direction such that the movement limiting surface 202 is located at the position e1 (the arrow aa1). In other words, the lower chuck 11A moves in the X direction with the position e1 set as the target position of the movement limiting surface 202. This moving operation of the lower chuck 11A can be realized when teaching for actually moving the movement limiting surface 202 of the lower chuck 11A to the position e1 is executed, for example.

Further, the other lower chuck 11B moves in the X direction (the arrow aa2) such that the movement limiting surface 202 is located at the position which is opposite to the position e1 with respect to the position e2 and the distance between the lower chucks 11A, 11B is smaller than the diameter of a substrate W. Thus, the substrate W is placed on the lower chucks 11A, 11B. Specifically, a plurality of portions of the outer peripheral end of the substrate W are supported on the plurality (four in the present example) of inclined support surfaces 201 of the lower chucks 11A, 11B. In this state, the lower chucks 11A, 11B are fixed.

Next, as shown in the third diagram from the top in FIG. 18, the upper chuck 12B moves in the X direction so as to be close to the upper holding device 10A (the arrow aa3). As shown in the fourth diagram from the top in FIG. 18, the upper chuck 12B moves in the X-direction until the abutment surface 301 is located at the position e2 (the arrow aa4) and then stops. In other words, the upper chuck 12B moves in the X direction with the position e2 set as the target position of the abutment surface 301. This moving operation of the upper chuck 12B can be realized when teaching for actually moving the abutment surface 301 of the upper chuck 12B to the position e2 is executed, for example.

During the above-mentioned movement, the abutment surface 301 of the upper chuck 12B presses one portion of the outer peripheral end of the substrate W on the inclined support surface 201 of the lower chuck 11B. Thus, the substrate W moves toward the upper holding device 10A.

In a case in which the abutment surface 301 of the upper chuck 12B arrives at the position e2, that is, the one portion of the outer peripheral end of the substrate W arrives at the position e2, another portion of the outer peripheral end of the substrate W abuts against the movement limiting surface 202 of the lower chuck 11A. Thus, the movement of the substrate W is limited by the movement limiting surface 202 such that the other portion of the outer peripheral end of the substrate W does not go past the position e1. In this state, the center wc of the substrate W is positioned at the position sc in the X direction.

When a substrate W is carried into the substrate cleaning device 1, the substrate transporting robot (not shown) positions the substrate W in the Y direction. Therefore, in the state shown in the fourth diagram from the top in FIG. 18, the substrate W is positioned such that the center wc of the substrate W overlaps with the plane reference position rp.

Here, in the fourth diagram from the top in FIG. 18 and the first to third side views from the top in FIG. 19, described below, the height position of the portion of the substrate W supported by the lower chuck 11A and the height position of the portion of the substrate W supported by the lower chuck 11B are slightly deviated from each other. However, the difference (deviation) between these height positions is negligibly small with respect to the diameter of the substrate W and has little influence on the positioning accuracy of the center wc of the substrate W.

Thereafter, in a case in which the substrate W is held between the upper holding devices 10A, 10B, that is, the substrate W is firmly fixed, the upper chuck 12A moves toward the upper holding device 10B (the arrow aa5) as shown in the top diagram in FIG. 19. At this time, the abutment surface 301 of the upper chuck 12A moves to a position closer to the upper holding device 10B than the position e1 and stops. Thus, the substrate W is deformed, and the outer peripheral end of the substrate W and the movement limiting surface 202 of the lower chuck 11A are spaced apart from each other by a small distance. Further, the substrate W is firmly fixed between the abutment surface 301 of the upper chuck 12A and the abutment surface 301 of the upper shuck 12B. This holding state corresponds to the example of FIG. 8. Thus, as described with reference to FIG. 9, the lower-surface center region of the substrate W can be physically cleaned with an appropriate force.

In a case in which being firmly fixed between the abutment surface 301 of the upper chuck 12A and the abutment surface 301 of the upper chuck 12B, the substrate W is deformed as described above. Even in such a case, the one portion of the outer peripheral end of the substrate W located close to the upper holding device 10B is held so as to be sandwiched between the inclined support surface 201 of the lower chuck 11B and the projection 302 of the upper chuck 12B in the up-and-down direction. Further, the other portion of the outer peripheral end of the substrate W located close to the upper holding device 10A is held so as to be sandwiched between the inclined support surface 201 of the lower chuck 11A and the projection 302 of the upper chuck 12A in the up-and-down direction. Therefore, the substrate W is prevented from moving out of the position between the upper chucks 12A, 12B.

After the lower-surface center region of the substrate W is cleaned, the substrate W held by the upper holding devices 10A, 10B is transferred onto the suction holder 21 by the receiving-transferring device 40 as described with reference to FIGS. 10 to 13. The receiving-transferring device 40 moves the substrate W only in the up-and-down direction by moving the plurality of support pins 41 in the up-and-down direction. Therefore, when the receiving-transferring device 40 receives a substrate W from the upper holding devices 10A, 10B, the substrate W is desirably positioned such that its center wc is located at the plane reference position rp.

As such, in the present embodiment, when the holding state of a substrate W is released, the upper holding devices 10A, 10B operate such that the center wc of the substrate W is located at the plane reference position rp. Specifically, when the holding state of a substrate W held by the upper chucks 12A, 12B is released, only the upper chuck 12A that presses another portion of the outer peripheral end of the substrate W move in the X direction away from the upper holding device 10B as shown in the second diagram from the top in FIG. 19 (the arrow aa6). In this case, when a pressing force applied from the upper chuck 12A to the substrate W is released, the other portion of the outer peripheral end of the substrate W abuts against the movement limiting surface 202 of the lower chuck 11A. On the other hand, one portion of the outer peripheral end of the substrate W is maintained abutting against the abutment surface 301 of the upper chuck 12B. Thus, the center wc of the substrate W is positioned at the plane reference position rp with a strong pressing force not applied to the substrate W.

Next, as shown in the third diagram from the top in FIG. 19, the upper chuck 12B that comes into contact with the one portion of the outer peripheral end of the substrate W moves in the X direction away from the upper holding device 10A (the arrow aa7). At this time, the center wc of the substrate W is maintained being positioned at the plane reference position rp. Thereafter, as described with reference to FIG. 11, the substrate W is received by the plurality of support pins 41 of the receiving-transferring device 40, and the upper holding devices 10A, 10B return to an initial state. The substrate W received by the plurality of support pins 41 is placed on the suction holder 21 with the center wc of the substrate W positioned at the plane reference position rp.

As described above, in the present embodiment, when a substrate W is released from being held by the upper chucks 12A, 12B, the upper chuck 12A moves such that the one upper chuck 12A is spaced apart from the substrate W before the other upper chuck 12B is spaced apart from the substrate W. In this case, when only the upper chuck 12A is spaced apart from the substrate W, only a pressing force is applied from the upper chuck 12B to the one portion of the outer peripheral end of the substrate W. Thus, the substrate W moves in a direction toward the upper holding device 10A. In this state, the movement of the substrate W is limited by the movement limiting surface 202 of the lower chuck 11A such that the other portion of the outer peripheral end of the substrate W does not go past the position e1. Therefore, even after being fixed by the upper chucks 12A, 12B, the substrate W can be easily positioned at a predetermined position with high accuracy.

4. Effects (1) In the above-mentioned substrate cleaning device 1, when a substrate W is carried in by the substrate transporting robot (not shown), the outer peripheral end of the carried substrate W is supported from a position below the substrate W by the support pieces 200 of the lower chucks 11A, 11B. In this state, the lower chuck 11B presses the one portion of the outer peripheral end of the substrate W toward the upper holding device 10A. Thus, the substrate W moves on the lower chucks 11A, 11B. At this time, the movement of the substrate W is limited by the movement limiting surface 202 of the lower chuck 11A such that the other portion of the outer peripheral end of the substrate W does not go past the predetermined position e1.

As a result, the positions e1, e2 are appropriately defined in accordance with the size of the substrate W, so that the substrate W supported on the lower chucks 11A, 11B can be positioned at a predetermined position with high accuracy.

(2) As described above, the plurality of inclined support surfaces 201 are provided at the support pieces 200 of the lower chucks 11A, 11B. Each inclined support surface 201 is formed so as to be capable of supporting the outer peripheral end of a substrate W and extend obliquely downwardly toward the substrate W to be supported. In this case, when the substrate W is supported on the lower chucks 11A, 11B, the contact areas between the inclined support surfaces 201 of the lower chucks 11A, 11B and the substrate W can be reduced. Therefore, an amount of contaminants or the like to be transferred is reduced, and a degree of degradation of cleanliness of the substrate W is reduced.

(3) Each of the lower chucks 11A, 11B is configured to be movable in a direction parallel to the X direction. Therefore, it is possible to smoothly move a substrate W supported by the lower chucks 11A, 11B to a position below the upper holding devices 10A, 10B by suitably adjusting the distance between the lower chucks 11A, 11B. Further, because the distance between the lower chucks 11A, 11B can be adjusted according to the size of a substrate W, the size range of the substrate W that can be aligned is increased.

(4) Each of the lower chucks 11A, 11B is configured to be movable in a direction parallel to the X direction. Therefore, it is possible to easily switch between a state in which a substrate W is firmly fixed and a state in which the substrate W is not firmly fixed by suitably adjusting the distance between the upper chucks 12A, 12B. Further, the distance between the upper chucks 12A, 12B can be adjusted in accordance with the size of a substrate W. Therefore, the size range of a substrate W that can be fixed between the upper chucks 12A, 12B is increased.

5. Other Embodiments (1) While a substrate W is positioned with respect to the suction holder 21 with the substrate W sandwiched by the movement limiting surface 202 of the lower chuck 11A and the abutment surface 301 of the upper chuck 12B in the above-mentioned embodiment, the present invention is not limited to this.

A substrate W may be positioned while being sandwiched by the movement limiting surface 202 of the lower chuck 11B and the abutment surface 301 of the upper chuck 12A instead of the movement limiting surface 202 of the lower chuck 11A and the abutment surface 301 of the upper chuck 12B. In this case, the upper holding devices 10A, 10B perform an operation that is to be performed in a reversed manner in the X direction with respect to the operation of the above-mentioned example of FIGS. 18 and 19. Thus, similarly to the example of FIGS. 18 and 19, the positions e1, e2 are appropriately defined in accordance with the size of the substrate W, whereby the substrate W supported on the lower chucks 11A, 11B can be positioned at a predetermined position with high accuracy.

(2) While the inclined support surfaces 201 are provided at the support pieces 200 of the lower chucks 11A, 11B in the above-mentioned embodiment, the present invention is not limited to the above-mentioned example. A support surface that is in parallel with the XY plane and flat may be provided at the support pieces 200 instead of the inclined support surface 201. In this case, because the lower surface of the substrate W and the support surface come into contact with each other, the support state of the substrate W is stabilized.

(3) The upper holding devices 10A, 10B may be configured to be capable of moving the lower chucks 11A, 11B and the upper chucks 12A, 12B in the up-and-down direction. In this case, the upper holding devices 10A, 10B may transfer a substrate W supported by the lower chucks 11A, 11B onto the suction holder 21 instead of the receiving-transferring device 40.

Alternatively, the lower chucks 11A, 11B of the upper holding devices 10A, 10B may receive a substrate W held by suction on the suction holder 21, and may hold the substrate W received at a position above the suction holder 21.

(4) While at least part of the lower chucks 11A, 11B and the upper chucks 12A, 12B of the upper holding devices 10A, 10B basically overlaps with the cup 61 in a plan view as shown in FIGS. 6 to 17 in the substrate cleaning device 1 according to the above-mentioned embodiment, the present invention is not limited to this. Each of the lower chucks 11A, 11B and the upper chucks 12A, 12B may be configured to be movable in the X direction to a position spaced apart from the cup 61 in a plan view. Further, in this case, the lower chucks 11A, 11B and the upper chucks 12A, 12B may be configured to be movable in the up-and-down direction.

(5) While a substrate W that is positioned by the upper holding devices 10A, 10B with respect to the suction holder 21 is transferred to the suction holder 21 in the above-mentioned embodiment, the present invention is not limited to this. For example, it is assumed that a substrate transporting robot (not shown) inserts a hand into the substrate cleaning device 1, receives a substrate W held by the upper holding devices 10A, 10B and transports the received substrate W. In this case, the upper holding devices 10A, 10B may position the substrate W at a predetermined receiving position because the receiving position at which the substrate W is to be received by the hand is predetermined. Thus, the received substrate W is arranged at the predetermined position in the hand. Therefore, accuracy in regard to transport of a substrate W is improved.

(6) While a cleaning process is performed on a substrate W after the substrate W positioned by the upper holding devices 10A, 10B is transferred to the suction holder 21 in the above-mentioned embodiment, the present invention is not limited to this. After a substrate W positioned by the upper holding devices 10A, 10B is transferred to the suction holder 21, an edge rinse process for removing a film provided at the peripheral portion of the substrate W may be performed on the substrate W held by suction by the suction holder 21. Alternatively, an edge exposure process for exposing a film provided at the peripheral portion of the substrate W may be performed. Also in these cases, a process can be performed on a substrate W held by suction by the suction holder 21 with high accuracy.

(7) A substrate W positioned by the upper holding devices 10A, 10B is transferred to the suction holder 21 in the above-mentioned embodiment, the present invention is not limited to this. The substrate W positioned by the upper holding devices 10A, 10B may be transferred onto a temperature adjustment plate that performs a heating process or a cooling process on the substrate W instead of the suction holder 21. In this case, the substrate W placed on the temperature adjustment plate can be subjected to the heating process or the cooling process with high accuracy.

(8) While the lower-surface outer region of a substrate W and the lower-surface brush 51 are cleaned in the lower holding device 20 after the lower-surface center region of the substrate W is cleaned in the upper holding devices 10A, 10B in the above-mentioned embodiment, the embodiment is not limited to this. The lower-surface center region of the substrate W may be cleaned in the upper holding devices 10A, 10B after the lower-surface outer region of the substrate W and the lower-surface brush 51 are cleaned in the lower holding device 20.

(9) While the upper surface of a substrate W is cleaned with use of the spray nozzle 73 in the above-mentioned embodiment, the embodiment is not limited to this. The upper surface of the substrate W may be cleaned with use of a brush or may be cleaned with use of a rinse nozzle that discharges a rinse liquid. Further, the upper surface of the substrate W does not have to be cleaned. In this case, the substrate cleaning device 1 does not include the upper-surface cleaning device 70. Similarly, the outer peripheral end of the substrate W does not have to be cleaned. In this case, the substrate cleaning device 1 does not include the end-portion cleaning device 80.

(10) While the substrate cleaning device 1 includes the control device 9 in the above-mentioned embodiment, the embodiment is not limited to this. In a case in which being configured to be controllable by an external information processing apparatus, the substrate cleaning device 1 does not have to include the control device 9.

(11) While a substrate W is positioned with respect to the suction holder 12 with the substrate W sandwiched by the movement limiting surface 202 of the lower chuck 11A and the abutment surface 301 of the upper chuck 12B in the above-mentioned embodiment, the present invention is not limited to this. A substrate W may be positioned while being sandwiched by the abutment surface 301 of the upper chuck 12B and the abutment surface 301 of the upper chuck 12A instead of the movement limiting surface 202 of the lower chuck 11A and the abutment surface 301 of the upper chuck 12B.

In this case, in the upper holding devices 10A, 10B, when a substrate W is carried in, for example, the lower chucks 11A, 11B move in the X direction such that the distance between the lower chucks 11A, 11B is smaller than the diameter of the substrate W. At this time, the movement limiting surfaces 202 of the lower chucks 11A, 11B are adjusted so as not to be located between the positions e1, e2. In this state, the substrate W is placed on the lower chucks 11A, 11B.

Thereafter, the abutment surface 301 of one of the upper chucks 12A, 12B moves to the position e1. After the abutment surface 301 of one of the upper chucks 12A, 12B arrives at the position e1, the abutment surface 301 of the other one of the upper chucks 12A, 12B moves to the position e2. Thus, similarly to the example of FIGS. 18 and 19, the positions e1, e2 are appropriately defined in accordance with the size of the substrate W, whereby the substrate W supported on the lower chucks 11A, 11B can be positioned at a predetermined position with high accuracy.
Correspondences Between Constituent Elements in Claims and Parts in Preferred Embodiments In the following paragraphs, non-limiting examples of correspondences between various elements recited in the claims below and those described above with respect to various preferred embodiments of the present disclosure are explained. As each of constituent elements recited in the claims, various other elements having configurations or functions described in the claims can be also used.

In the above-mentioned embodiment, the upper holding devices 10A, 10B are examples of a substrate alignment device, the lower chuck 11A is an example of a first support member, the upper chuck 12B is an example of a first pressing member, the upper chuck driver 14B is an example of a first pressing driver, the position e1 is an example of a prescribed position, and the movement limiting surface 202 is an example of a movement limiter.

Further, the inclined support surface 201 of the lower chuck 11A is an example of a first inclined support surface, the inclined support surface 201 of the lower chuck 11B is an example of a second inclined support surface, the lower chuck driver 13A is an example of a first support driver, the lower chuck driver 13B is an example of a second support driver, the upper chuck 12A is an example of a second pressing member, and the upper chuck driver 14A is an example of a second pressing driver.

Further, the abutment surface 301 of the upper chuck 12B is an example of a first abutment surface, the projection 302 of the upper chuck 12B is an example of a first upper-end projection, the abutment surface 301 of the upper chuck 12A is an example of a second abutment surface, the projection 302 of the upper chuck 12A is an example of a second upper-end projection, and the substrate cleaning device 1 is an example of a substrate processing apparatus.

While preferred embodiments of the present disclosure have been described above, it is to be understood that variations and modifications will be apparent to those skilled in the art without departing the scope and spirit of the present disclosure. The scope of the present disclosure, therefore, is to be determined solely by the following claims.

We claim:

1. A substrate alignment device that aligns a substrate, comprising:

first and second support members that are arranged to be opposite to each other and be spaced apart from each other in a plan view, and respectively support an outer peripheral end of the substrate from a position below the substrate;

a first pressing member that is arranged to be opposite to the first support member in a plan view, and moves the substrate on the first and second support members by pressing one portion of the outer peripheral end of the substrate in a first direction directed from the second support member toward the first support member with the substrate supported by the first and second support members;

a first pressing driver that drives the first pressing member;

a second pressing member that is arranged to be opposite to the second support member in a plan view, and presses another portion of the outer peripheral end of the substrate in a second direction opposite to the first direction;

a second pressing driver that drives the second pressing member; and a controller, wherein the first support member includes a movement limiter that limits movement of the substrate in the first direction past a predetermined prescribed position, the controller controls the first pressing driver with the movement limiter being at the prescribed position, to move the substrate supported on the first and second support members in the first direction and to cause the other portion of the substrate to abut against the movement limiter, and after the other portion of the substrate abuts against the movement limiter, the controller controls the second pressing driver with the one portion of the substrate supported by the first and second support members being pressed by the first pressing member, to cause the second pressing member to press the other portion of the outer peripheral end of the substrate in the second direction.

2. The substrate alignment device according to claim 1, wherein the first support member has a first inclined support surface that is capable of supporting the outer peripheral end of the substrate and extends obliquely downwardly toward the second support member, and the second support member has a second inclined support surface that is capable of supporting the outer peripheral end of the substrate and extends obliquely downwardly toward the first support member.

3. The substrate alignment device according to claim 1, wherein each of the first and second support members is configured to be movable in a direction parallel to the first direction, and the substrate alignment device further includes a first support driver that drives the first support member, and a second support driver that drives the second support member.

4. The substrate alignment device according to claim 1, wherein each of the first and second pressing members is configured to be movable in the first direction and the second direction.

5. A substrate processing apparatus comprising the substrate alignment device according to claim 1; and a processor that performs predetermined processing on the substrate aligned by the substrate alignment device.

6. A substrate alignment device that aligns a substrate, comprising:

first and second support members that are arranged to be opposite to each other and be spaced apart from each other in a plan view, and respectively support an outer peripheral end of the substrate from a position below the substrate;

a first pressing member that is arranged to be opposite to the first support member in a plan view, and moves the substrate on the first and second support members by pressing one portion of the outer peripheral end of the substrate in a first direction directed from the second support member toward the first support member with the substrate supported by the first and second support members;

a first pressing driver that drives the first pressing member;

a second pressing member that is arranged to be opposite to the second support member in a plan view, and presses another portion of the outer peripheral end of the substrate in a second direction opposite to the first direction with the substrate supported by the first and second support members and the one portion of the substrate pressed by the first pressing member; and a second pressing driver that drives the second pressing member, wherein the first support member includes a movement limiter that limits movement of the substrate in the first direction past a predetermined prescribed position, each of the first and second pressing members is configured to be movable in the first direction and the second direction, and the second pressing driver drives the second pressing member such that, after the second pressing member presses the other portion of the substrate in the second direction, the second pressing member is spaced apart from the other portion before the first pressing member is spaced apart from the one portion of the substrate.

7. A substrate alignment device that aligns a substrate, comprising:

first and second support members that are arranged to be opposite to each other and be spaced apart from each other in a plan view, and respectively support an outer peripheral end of the substrate from a position below the substrate;

a first pressing member that is arranged to be opposite to the first support member in a plan view, and moves the substrate on the first and second support members by pressing one portion of the outer peripheral end of the substrate in a first direction directed from the second support member toward the first support member with the substrate supported by the first and second support members;

a first pressing driver that drives the first pressing member;

a second pressing member that is arranged to be opposite to the second support member in a plan view, and presses another portion of the outer peripheral end of the substrate in a second direction opposite to the first direction with the substrate supported by the first and second support members and the one portion of the substrate pressed by the first pressing member; and a second pressing driver that drives the second pressing member, wherein the first support member includes a movement limiter that limits movement of the substrate in the first direction past a predetermined prescribed position, the first pressing member includes a first abutment surface that comes into contact with the one portion of the substrate, and a first upper-end projection that projects in the first direction from an upper end of the first abutment surface, and the second pressing member includes a second abutment surface that comes into contact with the other portion of the substrate, and a second upper-end projection that projects in the second direction from an upper end of the second abutment surface.

8. A substrate alignment method of aligning a substrate, including:

respectively supporting an outer peripheral end of the substrate from a position below the substrate using first and second support members by placing the substrate on the first and second support members that are arranged to be opposite to each other and spaced apart from each other in a plan view; and moving the substrate on the first and second support members by pressing one portion of the outer peripheral end of the substrate in a first direction directed from the second support member toward the first support member using a first pressing member arranged to be opposite to the first support member in a plan view with the substrate supported by the first and second support members, wherein the first support member includes a movement limiter that limits movement of the substrate in the first direction past a predetermined prescribed position, and the moving the substrate includes moving the substrate supported on the first and second support members in the first direction and causing another portion of the outer peripheral end of the substrate to abut against the movement limiter with the movement limiter being at the prescribed position, the substrate alignment method further including pressing the other portion of the substrate in a second direction opposite to the first direction using a second pressing member that is arranged to be opposite to the second support member in a plan view with the one portion of the substrate supported by the first and second support members pressed by the first pressing member after the other portion of the outer peripheral end of the substrate abuts against the movement limiter.

9. The substrate alignment method according to claim 8, further including moving each of the first and second support members in a direction parallel to the first direction.

10. The substrate alignment method according to claim 8, further including moving each of the first and second pressing members in the first direction and the second direction.

11. A substrate processing method including the substrate alignment method according to claim 8; and performing predetermined processing on the substrate aligned by the substrate alignment method.

12. A substrate alignment method of aligning a substrate, including:

respectively supporting an outer peripheral end of the substrate from a position below the substrate using first and second support members by placing the substrate on the first and second support members that are arranged to be opposite to each other and spaced apart from each other in a plan view;

moving the substrate on the first and second support members by pressing one portion of the outer peripheral end of the substrate in a first direction directed from the second support member toward the first support member using a first pressing member arranged to be opposite to the first support member in a plan view with the substrate supported by the first and second support members;

limiting movement of the substrate in the first direction past a predetermined prescribed position using a movement limiter provided at the first support member when the substrate moves on the first and second support members; and moving each of the first and second pressing members in the first direction and the second direction, wherein the moving each of the first and second pressing members in the first direction and the second direction includes causing the second pressing member to be spaced apart from the other portion of the substrate after the second pressing member presses the other portion of the substrate in the second direction before the first pressing member is spaced apart from the one portion of the substrate.

* * * * *